(12) United States Patent
Do et al.

(10) Patent No.: US 12,155,018 B2
(45) Date of Patent: Nov. 26, 2024

(54) LIGHT-EMITTING DEVICE AND DISPLAY DEVICE INCLUDING ROD SHAPED LIGHT EMITTING ELEMENTS AND COLOR CONVERSION ELEMENTS

(71) Applicant: SAMSUNG DISPLAY CO., LTD., Yongin-Si (KR)

(72) Inventors: Young Rag Do, Seoul (KR); Yun Jae Eo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 516 days.

(21) Appl. No.: 17/422,983

(22) PCT Filed: Jul. 15, 2019

(86) PCT No.: PCT/KR2019/008734
§ 371 (c)(1),
(2) Date: Jul. 14, 2021

(87) PCT Pub. No.: WO2020/149477
PCT Pub. Date: Jul. 23, 2020

(65) Prior Publication Data
US 2022/0077356 A1    Mar. 10, 2022

(30) Foreign Application Priority Data

Jan. 15, 2019    (KR) .................. 10-2019-0005452

(51) Int. Cl.
*H01L 33/50*    (2010.01)
*H01L 25/07*    (2006.01)
(Continued)

(52) U.S. Cl.
CPC ........ *H01L 33/508* (2013.01); *H01L 25/0753* (2013.01); *H01L 25/167* (2013.01);
(Continued)

(58) Field of Classification Search
CPC ... H01L 33/508; H01L 33/505; H01L 33/502; H01L 33/62; H01L 33/20; H01L 33/50;
(Continued)

(56) References Cited

U.S. PATENT DOCUMENTS 7,947,981 B2    5/2011 Yamazaki et al.
8,585,208 B2    11/2013 Akiyama
(Continued)

FOREIGN PATENT DOCUMENTS

CN    1542516    11/2004
CN    102468415    5/2012
(Continued)

OTHER PUBLICATIONS

Chinese Office Action, with English Translation, for Chinese Patent Application No. 201980089230.0, dated Sep. 25, 2023.
(Continued)

*Primary Examiner* — Ida M Soward
(74) *Attorney, Agent, or Firm* — KILE PARK REED & HOUTTEMAN PLLC

(57) ABSTRACT

A light emitting device may include a substrate. A light emitting element layer may be disposed on the substrate and may include light emitting elements having a rod shape. A color conversion layer may be disposed on the light emitting element layer and may include color conversion elements having a rod shape. A first alignment direction of the light emitting elements and a second alignment direction of the color conversion elements may be substantially parallel to each other or intersect at a predetermined angle.

15 Claims, 25 Drawing Sheets

(51) Int. Cl.
*H01L 25/075* (2006.01)
*H01L 25/16* (2023.01)
*H01L 23/00* (2006.01)

(52) U.S. Cl.
CPC ............ *H01L 33/505* (2013.01); *H01L 24/24* (2013.01); *H01L 24/95* (2013.01); *H01L 2224/24146* (2013.01); *H01L 2224/95145* (2013.01); *H01L 2933/0041* (2013.01)

(58) Field of Classification Search
CPC ......... H01L 33/06; H01L 33/38; H01L 24/24; H01L 24/95; H01L 25/0753; H01L 25/167; H01L 27/1214; H01L 27/156; H01L 2224/24146; H01L 2224/95145
See application file for complete search history.

(56) References Cited

U.S. PATENT DOCUMENTS

| | | | |
|---|---|---|---|
| 8,946,728 | B2 | 2/2015 | Kim |
| 9,773,761 | B2* | 9/2017 | Do .................... H05K 1/0295 |
| 10,211,418 | B2 | 2/2019 | Im et al. |
| 10,340,419 | B2 | 7/2019 | Kim et al. |
| 10,367,123 | B2* | 7/2019 | Im ........................ H01L 33/58 |
| 10,573,790 | B2 | 2/2020 | Monch et al. |
| 10,686,160 | B2 | 6/2020 | Gee et al. |
| 11,158,667 | B2 | 10/2021 | Varghese |
| 2007/0211193 | A1* | 9/2007 | Park .................... H01J 61/545 |
| | | | 313/483 |
| 2008/0284329 | A1 | 11/2008 | Bertram et al. |
| 2009/0278146 | A1 | 11/2009 | Maeda |
| 2013/0341588 | A1 | 12/2013 | Jeon et al. |
| 2017/0104036 | A1 | 4/2017 | Maeda |
| 2017/0357119 | A1 | 12/2017 | Kim et al. |
| 2018/0012876 | A1* | 1/2018 | Kim .................... H01L 33/387 |
| 2018/0019369 | A1* | 1/2018 | Cho .................... H01L 27/156 |
| 2018/0019377 | A1* | 1/2018 | Kim .................... H01L 27/156 |
| 2018/0175009 | A1* | 6/2018 | Kim ...................... H01L 33/20 |
| 2018/0175104 | A1* | 6/2018 | Kang .................. H01L 33/005 |
| 2018/0202616 | A1 | 7/2018 | Yoon et al. |
| 2018/0287010 | A1* | 10/2018 | Sung ................... B82B 3/0066 |
| 2019/0115513 | A1* | 4/2019 | Im ......................... H05K 1/111 |
| 2019/0172819 | A1* | 6/2019 | Bae ....................... H01L 33/54 |
| 2019/0244567 | A1* | 8/2019 | Cho ................... G09G 3/3233 |
| 2019/0245005 | A1* | 8/2019 | Kang ..................... H01L 27/15 |
| 2019/0251898 | A1* | 8/2019 | Cho ..................... H01L 27/156 |
| 2019/0305035 | A1* | 10/2019 | Cho ........................ H01L 33/46 |
| 2020/0159055 | A1* | 5/2020 | Robinson ............ G02F 1/13363 |

FOREIGN PATENT DOCUMENTS

| | | |
|---|---|---|
| CN | 102681310 | 9/2012 |
| DE | 102015101216 | 7/2016 |
| EP | 2635934 | 3/2017 |
| JP | 2004-264152 | 9/2004 |
| JP | 2006-332384 | 12/2006 |
| JP | 2008-503087 | 1/2008 |
| JP | 2012-129135 | 7/2012 |
| JP | 2016-42449 | 3/2016 |
| JP | 2018-503983 | 2/2018 |
| KR | 10-0955319 | 4/2010 |
| KR | 10-2012-0108479 | 10/2012 |
| KR | 10-2013-0055058 | 5/2013 |
| KR | 10-2013-0140689 | 12/2013 |
| KR | 10-1347896 | 1/2014 |
| KR | 10-2016-0026015 | 3/2016 |
| KR | 10-2016-0057561 | 5/2016 |
| KR | 10-2017-0042469 | 4/2017 |
| KR | 10-1730977 | 4/2017 |
| KR | 10-2018-0009014 | 1/2018 |
| KR | 10-2018-0009015 | 1/2018 |
| KR | 10-2020-0088959 | 7/2020 |
| KR | 10-2020-0088961 | 7/2020 |
| KR | 10-2020-0088962 | 7/2020 |
| WO | 2018/084419 | 5/2018 |
| WO | 2018/234154 | 12/2018 |

OTHER PUBLICATIONS

Extended European search report for European Patent Application or Patent No. 19910783.0 dated Sep. 15, 2022.
International Search Report, with English translation, corresponding to International Application No. PCT/KR2019/008734 dated Nov. 22, 2019.
Written Opinion, with English translation, corresponding to International Application No. PCT/KR2019/008734, dated Nov. 22, 2019.
Korean Notice of Allowance for Korean Patent Application No. 10-2019-0005452, dated Jun. 10, 2024.

* cited by examiner

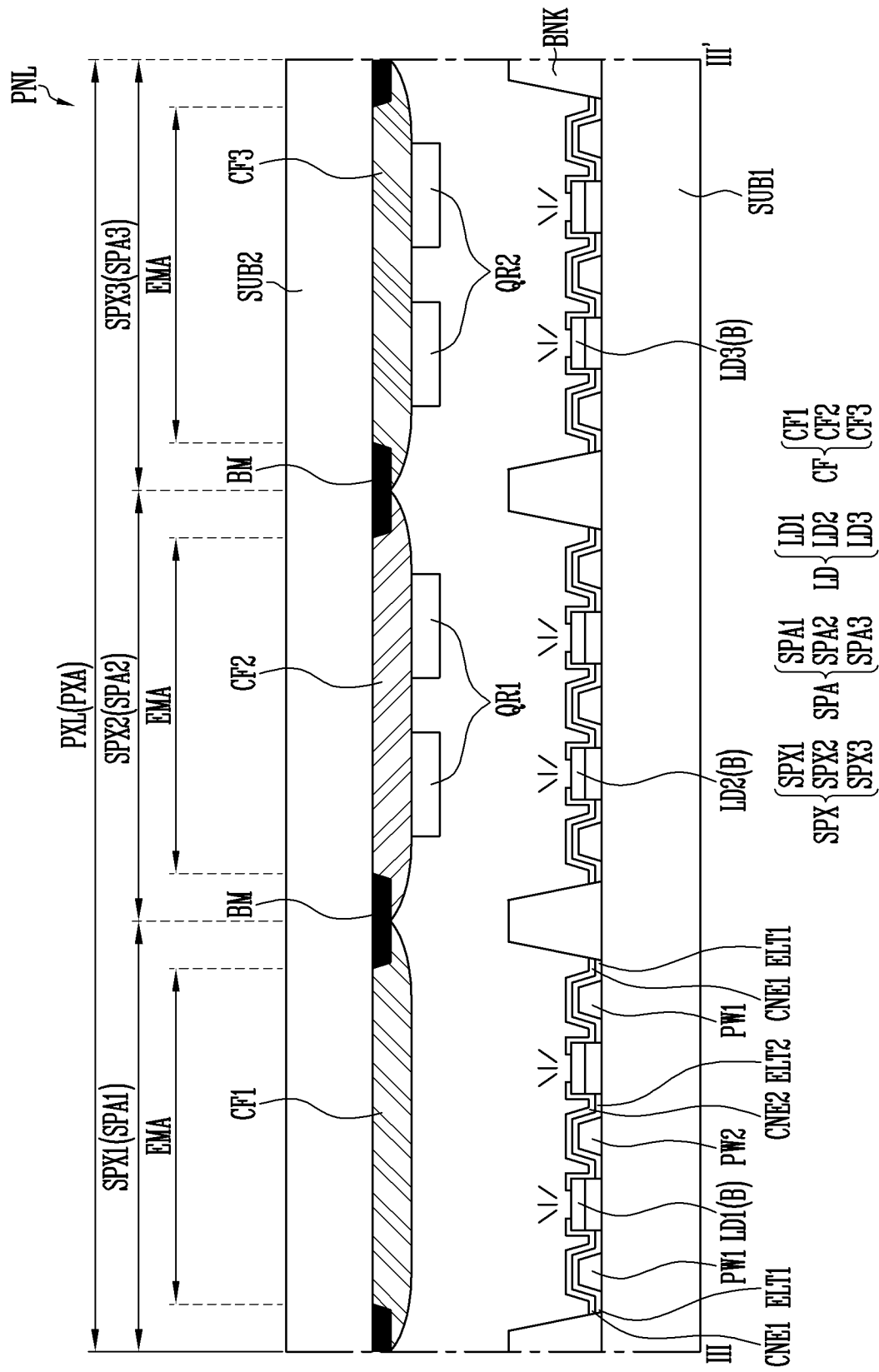

LIGHT-EMITTING DEVICE AND DISPLAY DEVICE INCLUDING ROD SHAPED LIGHT EMITTING ELEMENTS AND COLOR CONVERSION ELEMENTS

CROSS REFERENCE TO RELATED APPLICATION(S)

This application is a national entry of International Application No. PCT/KR2019/008734, filed on Jul. 15, 2019, which claims under 35 U.S.C. §§ 119(a) and 365(b) priority to and benefits of Korean Patent Application No. 10-2019-0005452, filed on Jan. 15, 2019 in the Korean Intellectual Property Office (KIPO), the entire contents of which are incorporated herein by reference.

BACKGROUND

1. Technical Field

Various embodiments of the disclosure relate to a light emitting device, a display device having the light emitting device, and a method of manufacturing the display device.

2. Description of the Related Art

Recently, a technique of manufacturing a subminiature light emitting element using a material having a highly reliable inorganic crystal structure and manufacturing a light emitting device using the light emitting element has been developed. For example, technology for configuring a light source of a light emitting device using subminiature light emitting elements having a small size ranging from a nanoscale to a microscale has been developed. Such a light emitting device may be used in various electronic devices such as a display device or a lighting device.

SUMMARY

A full color light emitting device may be implemented using monochromatic (e.g., blue) light emitting elements and color conversion elements (i.e., a color conversion material for converting the color of incident light to another color and then emitting the converted light).

However, rod-type light emitting elements emit linearly polarized light, and quantum dots generally used as the color conversion elements absorb the linearly polarized light and emit light in a Lambertian form, and thus the emission efficiency of light finally emitted from the light emitting device may be deteriorated.

The technical objects of the disclosure include providing a light emitting device having improved emission efficiency and a display device having the light emitting device.

The technical objects of the disclosure include providing a display device manufacturing method of manufacturing the display device.

In order to accomplish an object of the disclosure, a light emitting device according to embodiments of the disclosure may include a substrate; a light emitting element layer disposed on the substrate and including a plurality of light emitting elements having a rod shape; and a color conversion layer disposed on the light emitting element layer and including a plurality of color conversion elements having a rod shape. A first alignment direction of the light emitting elements and a second alignment direction of the color conversion elements may be substantially parallel to each other or intersect at a predetermined angle.

According to an embodiment, each of the plurality of color conversion elements may be a quantum rod.

According to an embodiment, the quantum rod may convert first monochromatic light emitted from the plurality of light emitting elements into second monochromatic light.

According to an embodiment, the predetermined angle between the second alignment direction and the first alignment direction may be about 30 or less degrees.

According to an embodiment, the first alignment direction may be a direction in which ¾ or more of the plurality of light emitting elements are arranged, and the second alignment direction may be a direction in which ¾ or more of the plurality of color conversion elements are arranged.

According to an embodiment, the light emitting element layer may further include a first electrode and a second electrode disposed on the substrate and spaced apart from each other; and a first insulating layer disposed on the first and second electrodes and the substrate. The plurality of light emitting elements are disposed between the substrate and the first insulating layer and between the first electrode and the second electrode.

According to an embodiment, the light emitting device may further include a common electrode layer disposed between the substrate and the light emitting element layer; and a second insulating layer disposed between the common electrode layer and the light emitting element layer. The common electrode layer may include a first common electrode and a second common electrode disposed to be spaced apart from each other, the first common electrode overlaps the first electrode and may be electrically disconnected from the first electrode, and the second common electrode may overlap the second electrode.

According to an embodiment, the plurality of light emitting elements may be disposed between the first and second electrodes and the second insulating layer, a first end of each of the plurality of light emitting elements may be electrically connected to the first electrode, and a second end of each of the plurality of light emitting elements may be electrically connected to the second electrode.

According to an embodiment, the plurality of color conversion elements may be disposed between the first common electrode and the second common electrode in a plan view.

According to an embodiment, the substrate may include a first sub-pixel area, a second sub-pixel area, and a third sub-pixel area, the plurality of light emitting elements may emit light of a first color, the plurality of color conversion elements may include a first color conversion element arranged in the second sub-pixel area and converting the light of the first color into light of a second color, and a second color conversion element arranged in the third sub-pixel area and converting the light of the first color into light of a third color.

In order to accomplish an object of the disclosure, a display device according to embodiments of the disclosure may include a first substrate; a light emitting element layer including a plurality of light emitting elements having a rod shape and disposed on the first substrate; a color conversion layer including a plurality of color conversion elements having a rod shape and disposed on the light emitting element layer; and a second substrate disposed on the color conversion layer. A first alignment direction of the light emitting elements and a second alignment direction of the color conversion elements may be substantially parallel to each other.

According to an embodiment, the light emitting element layer may further include a first electrode and a second electrode disposed on the first substrate and spaced apart from each other, and the plurality of light emitting elements may be disposed between the first electrode and the second electrode.

According to an embodiment, the display device may further include a pixel circuit layer disposed between the first substrate and the light emitting element layer, the pixel circuit layer including a plurality of transistors and a power line. The first electrode may be electrically connected to a first electrode of a first transistor of the plurality of transistors, through a first contact hole passing through at least a part of the pixel circuit layer, and the second electrode may be electrically connected to the power line through a second contact hole passing through at least a part of the pixel circuit layer.

According to an embodiment, the light emitting element layer may further include a first contact electrode electrically connecting a first end of each of the plurality of light emitting elements to the first electrode; and a second contact electrode electrically connecting a second end of each of the plurality of light emitting elements to the second electrode, and the first contact electrode and the second contact electrode are disposed on a same layer.

According to an embodiment, the light emitting element layer may further include a first bank pattern disposed between the first electrode and the pixel circuit layer; and a second bank pattern disposed between the second electrode and the pixel circuit layer.

In order to accomplish an object of the disclosure, a method of manufacturing a display device according to embodiments of the disclosure may include forming a first common electrode and a second common electrode spaced apart from each other on a substrate; forming a first insulating layer on the substrate and on the first and second common electrodes; arranging a plurality of light emitting elements on the first insulating layer, and aligning the plurality of light emitting elements having a rod shape between the first common electrode and the second common electrode in a plan view; forming a first electrode on a first end of each of the plurality of light emitting elements and a second electrode on a second end of each of the plurality of light emitting elements; forming a second insulating layer on the plurality of light emitting elements, the first and second electrodes, and the first insulating layer; and aligning a plurality of color conversion elements having a rod shape on the second insulating layer. A first alignment direction of the light emitting elements and a second alignment direction of the color conversion elements may be substantially parallel to each other or intersect at a predetermined angle.

According to an embodiment, each of the plurality of color conversion elements may be a quantum rod converting first monochromatic light emitted from the plurality of light emitting elements into second monochromatic light.

According to an embodiment, the predetermined angle between the second alignment direction and the first alignment direction may be about 30 or less degrees.

The first electrode may overlap at least a part of the first common electrode, and the second electrode may overlap at least a part of the second common electrode.

The aligning of the plurality of color conversion elements may include providing the plurality of color conversion elements on the second insulating layer; and applying an alternating current voltage to the first common electrode and to the second common electrode.

A light emitting device and a display device according to embodiments of the disclosure include rod-type color conversion elements arranged substantially parallel to the rod-type light emitting elements, so that light absorption efficiency of the color conversion elements and emission efficiency obtained through the color conversion elements may be improved, and thus the emission efficiency of the light emitting device may be enhanced.

A method of manufacturing a display device according to embodiments of the disclosure may respectively align rod-type light emitting elements and color conversion elements using common electrodes, thus enabling a display device including the light emitting elements and the color conversion elements that are arranged in the same direction to be manufactured.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 18 is a cross-sectional view schematically illustrating an example display device taken along line III-III' of FIG. 15.

DETAILED DESCRIPTION OF THE EMBODIMENTS

Figure 1A:
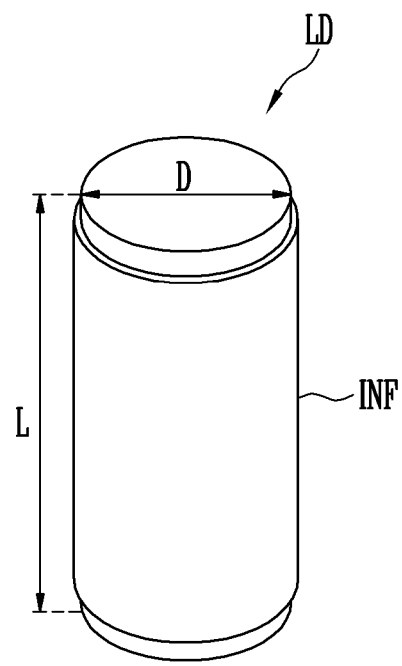
FIGS. 1A and 1B are a perspective view and a sectional view schematically illustrating a light emitting element according to an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure may be modified and practiced in various forms rather than being limited by the following embodiments.

Some elements which are not directly related to the features of the disclosure in the drawings may be omitted to clearly explain the disclosure. Further, the sizes, ratios, and the like of some elements in the drawings may be exaggerated. It should be noted that the same reference numerals are used to designate the same or similar elements throughout the drawings, and thus repeated descriptions thereof will be omitted.

Terms such as first and second may be used to identify and describe various components, but they should not limit the various components. Further, in the specification, it should be understood that the terms such as "include" or "have" are merely intended to indicate that features, numbers, steps, operations, components, parts, or combinations thereof are present, and are not intended to exclude the possibility that one or more other features, numbers, steps, operations, components, parts, or combinations thereof will be present or added. Furthermore, when a first part such as a layer, a film, a region, or a plate is disposed on a second part, the first part may be not only directly on the second part but a third part may intervene between them. Furthermore, a specific location or direction defined in the following description is merely described from a relative standpoint, and it should be noted that the location or direction may be changed depending on, for example, a view or orientation.

Embodiments and required details of the disclosure are described with reference to the accompanying drawings in order to describe the disclosure in detail so that those having ordinary knowledge in the technical field to which the disclosure pertains can readily practice the disclosure. Furthermore, a singular form may include a plural meaning as long as it is not specifically mentioned in a sentence.

Figure 1B:
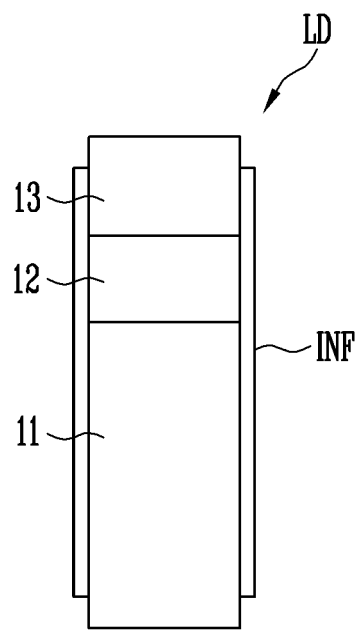

FIGS. 1A and 1B are a schematic perspective view and a schematic sectional view illustrating a light emitting element according to an embodiment. Although FIGS. 1A and 1B illustrate a cylindrical rod-type light emitting element LD, the type and/or shape of the light emitting element LD according to the disclosure is not limited thereto.

Referring to FIGS. 1A and 1B, the light emitting element LD may include a first conductive semiconductor layer 11, a second conductive semiconductor layer 13, and an active layer 12 interposed between the first and second conductive semiconductor layers 11 and 13. In an example, the light emitting element LD may be formed as a stacked body in which the first conductive semiconductor layer 11, the active layer 12, and the second conductive semiconductor layer 13 are sequentially stacked in a direction.

In an embodiment, the light emitting element LD may be provided in the form of a rod extending in a direction. The light emitting element LD may have a first end and a second end in a direction.

In an embodiment, one of the first and second conductive semiconductor layers 11 and 13 may be disposed on the first end of the light emitting element LD, and the other of the first and second conductive semiconductor layers 11 and 13 may be disposed on the second end of the light emitting element LD.

In an embodiment, the light emitting element LD may be a rod-type light emitting diode fabricated in the form of a rod. Here, the rod-type embraces a rod-like shape or a bar-like shape such as a cylindrical shape or a prismatic shape, which is longer in a longitudinal direction than in a widthwise direction (for example, which has an aspect ratio greater than 1), and the cross-sectional shape thereof is not particularly limited. For example, the length L of the light emitting element LD may be greater than the diameter D thereof (or the width of the cross-section thereof).

In an embodiment, the light emitting element LD may have a size in a range of a nanoscale to a microscale, e.g., a diameter D and/or a length L falling within a microscale or nanoscale range. However, the size of the light emitting element LD is not limited thereto. For example, the size of the light emitting element LD may be changed in various ways depending on design conditions of various types of devices, e.g., a display device which employs, as a light source, a light emitting device using the light emitting element LD.

The first conductive semiconductor layer 11 may include at least one n-type semiconductor layer. For instance, the first conductive semiconductor layer 11 may include one semiconductor material of InAlGaN, GaN, AlGaN, InGaN, AlN, and InN and may be doped with a first conductive dopant such as Si, Ge, or Sn. However, the material forming the first conductive semiconductor layer 11 is not limited to this, and the first conductive semiconductor layer 11 may be formed of various materials. The thickness of the first conductive semiconductor layer 11 may be, but is not limited to, about 500 nm to about 5 μm.

The active layer 12 may be disposed on the first conductive semiconductor layer 11 and may have a single or multi-quantum well structure. In an embodiment, a cladding layer (not shown) doped with a conductive dopant may be formed on and/or under the active layer 12. For example, the cladding layer may be formed as an AlGaN layer or an InAlGaN layer. In an embodiment, a material such as AlGaN or AlInGaN may be used to form the active layer 12, and various other materials may be used to form the active layer 12.

In case that an electric field of a predetermined voltage or greater is applied to the opposite ends of the light emitting element LD, the light emitting element LD may emit light while electron-hole pairs are coupled in the active layer 12. Since light emission by the light emitting element LD is controlled based on the foregoing principle, the light emitting element LD may be used as a light source of various light emitting devices as well as pixels of a display device. The thickness of the active layer 12 may be, but is not limited to, about 10 nm to about 200 nm.

The second conductive semiconductor layer 13 may be disposed on the active layer 12 and may include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor material corresponding to at least one of InAlGaN, GaN, AlGaN, InGaN, AlN, and InN and may be doped with a second conductive dopant such as Mg. However, the material forming the second conductive semiconductor layer 13 is not limited to this, and the second conductive semiconductor layer 13 may be formed of various materials. The thickness of the second conductive semiconductor layer 13 may be, but is not limited to, about 50 nm to about 500 nm.

In an embodiment, the light emitting element LD may further include an insulating film INF provided on a surface thereof. The insulating film INF may be formed on the surface of the light emitting element LD to at least enclose an outer circumferential surface of the active layer 12, and the insulating film INF may further enclose a portion of each of the first and second conductive semiconductor layers 11 and 13. Here, the insulating film INF may expose the opposite ends of the light emitting element LD having different polarities. For example, the insulating film INF may expose a first end of each of the first and second conductive semiconductor layers 11 and 13 that are disposed on the respective opposite ends of the light emitting element LD in a longitudinal direction, and e.g., may expose two surfaces (for example, top and bottom surfaces) of the cylinder, rather than covering the same.

In an embodiment, the insulating film INF may include, but is not limited to, at least one insulating material of $SiO_2$, $Si_3N_4$, $Al_2O_3$, and $TiO_2$. In other words, the material forming the insulating film INF is not limited to a particular material, and the insulating film INF may be formed of various insulating materials.

In an embodiment, the light emitting element LD may further include additional components as well as the first conductive semiconductor layer 11, the active layer 12, the second conductive semiconductor layer 13, and the insulating film INF. For example, the light emitting element LD may further include one or more fluorescent layers, active layers, semiconductor layers and/or electrode layers disposed on first ends of the first conductive semiconductor layer 11, the active layer 12, and/or the second conductive semiconductor layer 13.

Figure 2A:
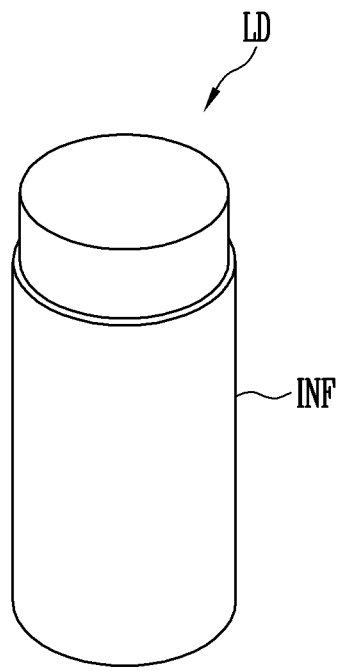
FIGS. 2A and 2B are a perspective view and a sectional view schematically illustrating a light emitting element according to another embodiment of the disclosure.
Figure 2B:
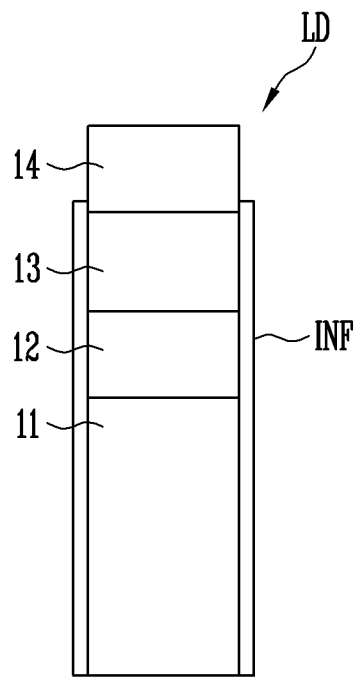
Figure 3A:
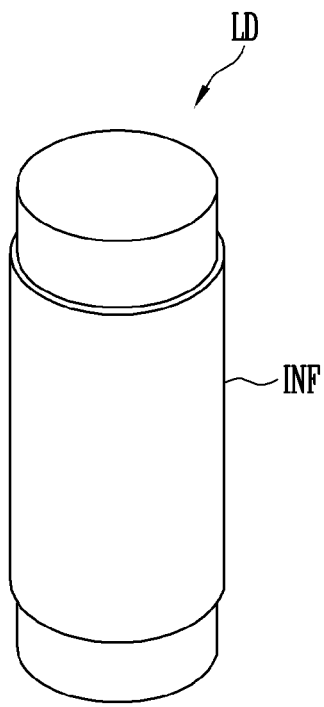
FIGS. 3A and 3B are a perspective view and a sectional view schematically illustrating a light emitting element according to a further embodiment of the disclosure.
Figure 3B:
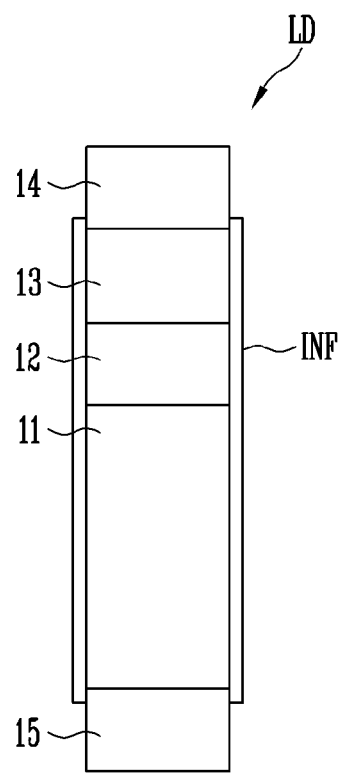

FIGS. 2A and 2B are a schematic perspective view and a schematic sectional view illustrating a light emitting element according to an embodiment. FIGS. 3A and 3B are a schematic perspective view and a schematic sectional view illustrating a light emitting element according to an embodiment.

Referring to FIGS. 2A and 2B, the light emitting element LD may further include at least one electrode layer 14 disposed on an end of the second conductive semiconductor layer 13.

Referring to FIGS. 3A and 3B, the light emitting element LD may further include at least one additional electrode layer 15 disposed on an end of the first conductive semiconductor layer 11.

Each of the electrode layers 14 and 15 may be, but is not limited to, an ohmic contact electrode. Each of the electrode layers 14 and 15 may include a metal or conductive metal oxide and may be formed by using, for example, chromium (Cr), titanium (Ti), aluminum (Al), gold (Au), nickel (Ni), indium tin oxide (ITO), indium zinc oxide (IZO), indium tin zinc oxide (ITZO), and an oxide or alloy thereof alone or in combination. The electrode layers 14 and 15 may be substantially transparent or translucent. Therefore, light generated from the light emitting element LD may be emitted to the outside of the light emitting element LD after passing through the electrode layers 14 and 15. The thickness of each of the electrode layers 14 and 15 may be, but is not limited to, about 1 nm to about 200 nm.

In an embodiment, the insulating film INF may at least partially enclose the outer surfaces of the electrode layers 14 and 15 or may not enclose them. In other words, the insulating film INF may be selectively formed on the surfaces of the electrode layers 14 and 15. Furthermore, the insulating film INF may expose the opposite ends of the light emitting element LD having different polarities, and for example, may expose at least an area of each of the electrode layers 14 and 15. However, the disclosure is not limited thereto, and the insulating film INF may not be provided.

The insulating film INF may be provided on the surface of the light emitting element LD, for example, on the surface of the active layer 12, thereby preventing the active layer 12 from short-circuiting with at least one electrode (e.g., at least one of contact electrodes electrically connected to the opposite ends of the light emitting element LD) or the like. Therefore, the electrical stability of the light emitting element LD may be secured.

Further, the insulating film INF may be formed on the surface of the light emitting element LD, thereby minimizing defects in the surface of the light emitting element LD and improving the lifespan and efficiency of the light emitting element LD. Further, the insulating film INF may be formed on the surface of the light emitting element LD, thereby preventing an undesired short-circuit between light emitting elements LD even if the light emitting elements LD are arranged close to each other.

In an embodiment, the light emitting element LD may be manufactured by a surface process (e.g., coating). For example, in case that the light emitting elements LD are mixed with a fluidic solution and are supplied to respective emission areas (e.g., emission areas of respective pixels, see FIG. 18), the light emitting elements LD may be uniformly distributed or dispersed without being agglomerated in the solution. Here, an emission area (or light emission area) may be an area in which light is emitted from the light emitting elements LD and may be distinguished from a non-emission area in which light is not emitted.

A light emitting device including light emitting elements LD may be used in various types of devices requiring a light source, as well as in a display device. For example, micro light emitting elements LD may be arranged in each pixel area of a display panel, and an emission unit of each pixel may be configured through (or formed of) the light emitting elements LD. However, the field of application of the light emitting elements LD in the disclosure is not limited to a display device. For example, the light emitting elements LD may also be used in other types of devices such as a lighting device, which requires a light source.

Figure 4:
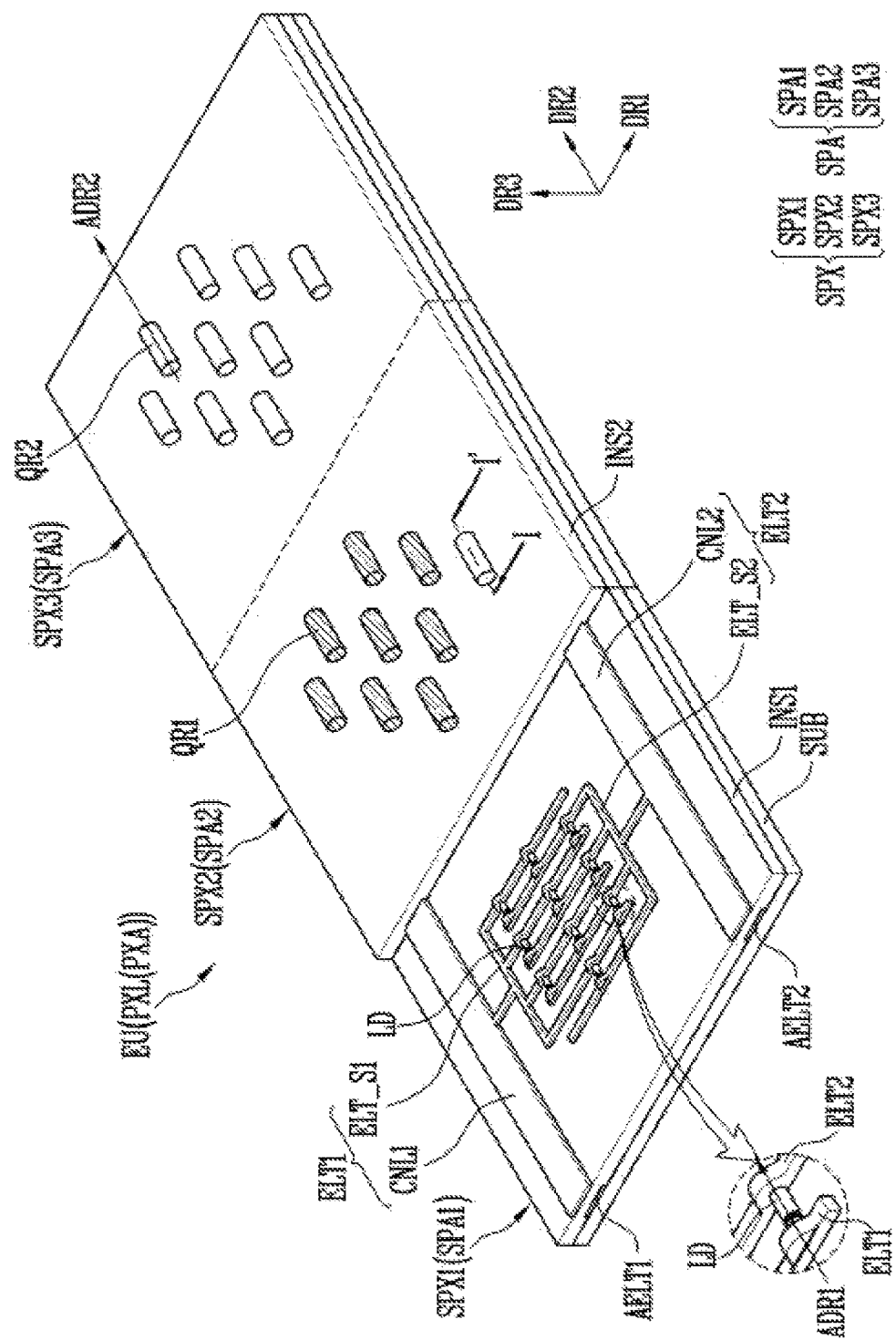
FIG. 4 is a perspective view schematically illustrating a light emitting device according to an embodiment of the disclosure.

FIG. 4 is a schematic perspective view illustrating a light emitting device according to an embodiment. FIG. 4 illustrates a light emitting device EU as an example of a device that may use the light emitting elements LD (including first, second, and third light emitting elements LD1, LD2, and LD3) described with reference to FIGS. 1A to 3B, as light sources. FIG. 4 schematically illustrates the light emitting device EU, focusing on a pixel PXL of the light emitting device EU. Here, the pixel PXL may be a unit for displaying full color light and may include sub-pixels SPX, each of which may emit monochromatic light and independently adjust the luminance thereof. Hereinafter, the light emitting device EU will be described with reference to an example case where the pixel PXL includes three sub-pixels SPX1, SPX2, and SPX3.

Figure 5:
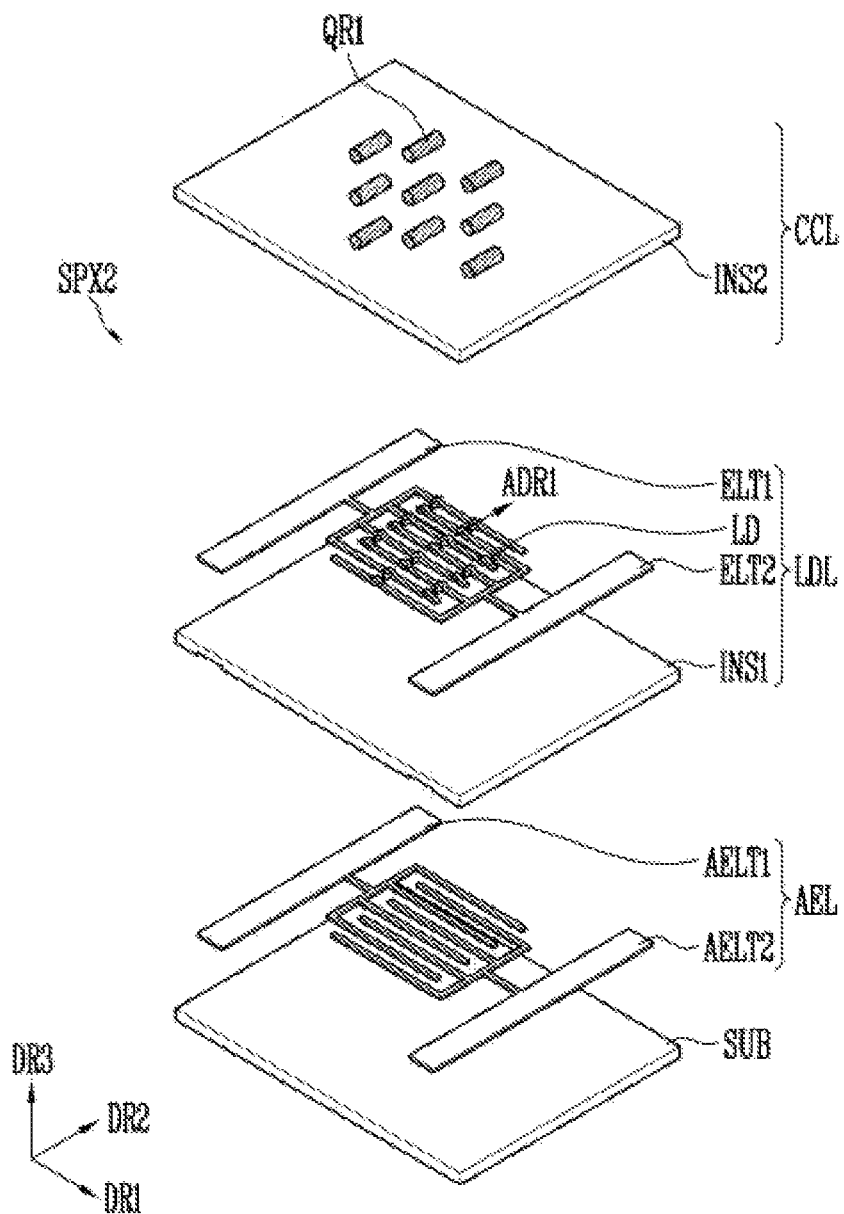
FIG. 5 is an exploded perspective view schematically illustrating the light emitting device of FIG. 4.
Figure 6:
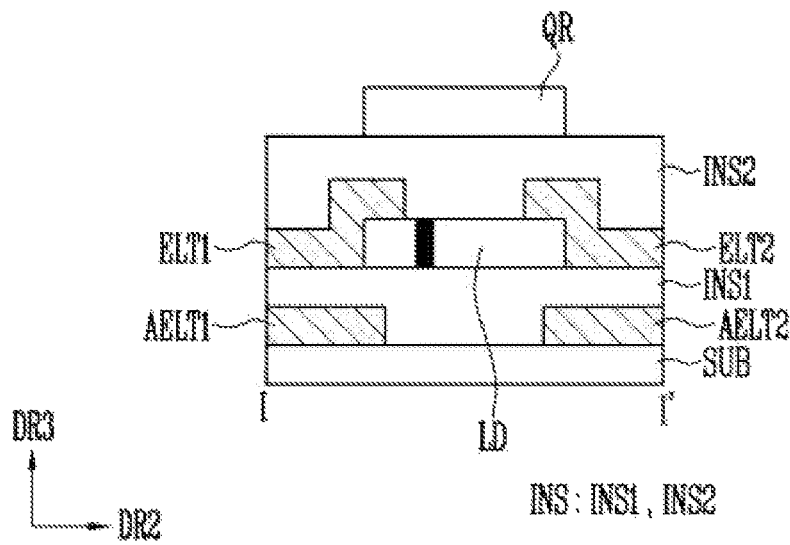
FIG. 6 is a cross-sectional view schematically illustrating an example of a light emitting device taken along line I-I' of FIG. 4.

FIG. 5 is a schematic exploded perspective view of the light emitting device of FIG. 4. FIG. 5 illustrates the structure of the light emitting device EU (or the pixel PXL) of FIG. 4, focusing on the second sub-pixel SPX2. FIG. 6 is a schematic cross-sectional view illustrating an example light emitting device taken along line I-I' of FIG. 4.

Referring to FIGS. 4 to 6, the pixel PXL may be formed in a pixel area PXA defined on a substrate SUB. The pixel area PXA may include sub-pixel areas SPA corresponding to sub-pixels SPX forming the pixel PXL.

For example, the pixel area PXA may include a first sub-pixel area SPA1 in which the first sub-pixel SPX1 is formed, a second sub-pixel area SPA2 in which the second sub-pixel SPX2 is formed, and a third sub-pixel area SPA3 in which the third sub-pixel SPX3 is formed.

In an embodiment, the first sub-pixel SPX1 may include a first electrode ELT1 and a second electrode ELT2 arranged in the first sub-pixel area SPA1 corresponding thereto and spaced apart from each other and at least one light emitting element LD electrically connected between the first and second electrodes ELT1 and ELT2. In an example, the first sub-pixel SPX1 may include light emitting elements LD electrically connected in parallel between the first and second electrodes ELT1 and ELT2.

In an embodiment, the second sub-pixel SPX2 may include a first electrode ELT1 and a second electrode ELT2 arranged in the second sub-pixel area SPA2 corresponding thereto and spaced apart from each other and at least one light emitting element LD electrically connected between the first and second electrodes ELT1 and ELT2. In an example, the second sub-pixel SPX2 may include light emitting elements LD electrically connected in parallel between the first and second electrodes ELT1 and ELT2. The second sub-pixel SPX2 may further include first color conversion elements QR1 arranged in the second sub-pixel area SPA2.

In an embodiment, the third sub-pixel SPX3 may include a first electrode ELT1 and a second electrode ELT2 arranged in the third sub-pixel area SPA3 corresponding thereto and spaced apart from each other, and at least one light emitting element LD electrically connected between the first and second electrodes ELT1 and ELT2. In an embodiment, the third sub-pixel SPX3 may include light emitting elements LD electrically connected in parallel between the first and second electrodes ELT1 and ELT2. The third sub-pixel SPX3 may further include second color conversion elements QR2 disposed in the third sub-pixel area SPA3.

Since the first sub-pixel SPX1 and the second sub-pixel SPX2 are substantially the same except for the color conversion elements, and the third sub-pixel SPX3 is substantially the same as the second sub-pixel SPX2, the first to third sub-pixels SPX1, SPX2, and SPX3 will be described, focusing on the second sub-pixel SPX2.

The light emitting device EU may include the substrate SUB, a common electrode layer AEL, a light emitting element layer LDL, and a color conversion layer CCL.

The substrate SUB may form a base member for the light emitting device EU.

In an embodiment, the substrate SUB may be a rigid or flexible substrate, and the material or properties thereof are not particularly limited. For example, the substrate SUB may be a rigid substrate made of glass or reinforced or tempered glass, or a flexible substrate formed of a thin film made of a plastic or metal material. Furthermore, the substrate SUB may be, but is not limited to, a transparent substrate. In an embodiment, the substrate SUB may be a translucent substrate, an opaque substrate, or a reflective substrate.

The common electrode layer AEL (or an alignment electrode layer) may be disposed on the substrate SUB and may include a first common electrode AELT1 (or a first alignment electrode) and a second common electrode AELT2 (or a second alignment electrode).

The first common electrode AELT1 and the second common electrode AELT2 may be arranged in each sub-pixel area SPA and spaced apart from each other and may be disposed such that at least portions thereof face each other.

In embodiments, each of the first common electrode AELT1 and the second common electrode AELT2 may include a stem electrode and at least one branch electrode (hereinafter referred to as a branch electrode). The stem electrode may extend in a second direction DR2 within the corresponding sub-pixel area SPA. The stem electrode may extend from the corresponding sub-pixel area SPA (e.g., the second sub-pixel area SPA2) to other sub-pixel areas (e.g., the first and third sub-pixel areas SPA1 and SPA3). The branch electrode may extend from the stem electrode in a first direction DR1 intersecting the second direction DR2. For example, as illustrated in FIG. 5, each of the first and second common electrodes AELT1 and AELT2 may include four branch electrodes branching off from the stem electrode. The branch electrodes of the first common electrode AELT1 and the branch electrodes of the second common electrode AELT2 may be alternately arranged in the second direction DR2 at intervals. A distance (or an interval) between the branch electrodes of the first common electrode AELT1 and the branch electrodes of the second common electrode AELT2 may be less than or equal to the length of each of the light emitting elements LD, but the distance is not limited thereto. The line width and the thickness of each of the first and second common electrodes AELT1 and AELT2 may vary with a voltage applied thereto, but the line width of each of the first and second common electrodes AELT1 and AELT2 may range from about 100 nm to about 50 μm, and the thickness of each of the first and second common electrodes AELT1 and AELT2 may range from 0.1 μm to 10 μm.

However, the shapes and/or the mutual arrangement relationship of the first and second common electrodes AELT1 and AELT2 may be changed in various manners.

Although FIG. 4 illustrates that each of the first and second common electrodes AELT1 and AELT2 includes four branch electrodes, the disclosure is not limited thereto. In an embodiment, in FIG. 4, each of the first and second common electrodes AELT1 and AELT2 may include three or less branch electrodes or five or more branch electrodes, and in another embodiment, the first common electrode AELT1 may include two branch electrodes, and the second common electrode AELT2 may include one branch electrode (see FIG. 15).

Each of the first and second common electrodes AELT1 and AELT2 may include at least one conductive material. In an example, each of the first and second common electrodes AELT1 and AELT2 may include, but is not limited to, a material corresponding to at least one of a metal such as Ag, Mg, Al, Pt, Pd, Au, Ni, Nd, Ir, Cr, Ti, or an alloy thereof, a conductive oxide such as ITO, IZO, ZnO, or ITZO, and a conductive polymer such as poly(3,4-ethylenedioxythiophene) (PEDOT).

In embodiments, each of the first and second common electrodes AELT1 and AELT2 may have a single-layer or multi-layer structure. For example, the first common electrode AELT1 may have a multi-layer structure including a first reflective electrode and a first conductive capping layer, and the second common electrode AELT2 may have a multi-layer structure including a second reflective electrode and a second conductive capping layer.

The reflective electrode of each of the first and second common electrodes AELT1 and AELT2 may include (or be made of) a conductive material having uniform reflectivity.

For example, the reflective electrode may include, but is not limited to, at least one of metals such as Ag, Mg, Al, Pt, Pd, Au, Ni, Nd, Ir, Cr, and an alloy thereof.

The light emitting element layer LDL (or an emission unit or a light emitting electrode assembly) may be disposed on the substrate SUB (and the common electrode layer AEL) and may include a first insulating layer INS1, a first electrode ELT1, a second electrode ELT2, and light emitting elements LD. Here, each of the light emitting elements LD may be a rod-type light emitting diode according to one of the embodiments of FIGS. 1A to 3B.

The first insulating layer INS1 may be disposed on the substrate SUB and the common electrode layer AEL For example, the first insulating layer INS1 may cover or overlap at least a portion of each of the first and second common electrodes AELT1 and AELT2, or may be disposed on the overall surface of the substrate SUB.

The first insulating layer INS1 may be formed in a single-layer or multi-layer structure and may include at least one inorganic insulating material and/or at least one organic insulating material. For example, each first insulating layer INS1 may include various types of organic/inorganic insulating materials including $SiN_x$, and the material forming the first insulating layer INS1 is not particularly limited.

The light emitting elements LD may be disposed on the first insulating layer INS1.

In an embodiment, each of the light emitting elements LD may be a light emitting diode which is made of material having an inorganic crystal structure and has a subminiature size ranging from a nanoscale to a microscale. For example, each of the light-emitting elements LD may be a subminiature rod-type light emitting diode, which is illustrated in FIGS. 1A to 3B and has a size to a degree of the nanoscale to the microscale. However, the types of light emitting elements LD that may be applied to the disclosure are not limited thereto. For example, each of the light emitting elements LD may be formed by a growth method and may be, for example, a light emitting diode having a core-shell structure of a size ranging from a nanoscale to a microscale.

In an embodiment, the light emitting elements LD may be disposed between the first common electrode AELT1 and the second common electrode AELT2 (or between the first electrode ELT1 and the second electrode ELT2) facing each other in a plan view. The light emitting elements LD may be aligned (or arranged) in a second direction DR2, and a first alignment direction ADR1 of the light emitting elements LD may be identical to the second direction DR2. Here, the first alignment direction ADR1 may be a direction which the major axes of the light emitting elements LD face on average, for example, a direction in which 70% or more of the light emitting elements LD face. Similarly, if the light emitting elements LD are aligned in the second direction DR2, it means that about 70% or more of the light emitting elements LD are aligned within a range of about ±20° with respect to the second direction DR2. Accordingly, at least one of the light emitting elements LD may be arranged in a diagonal direction.

In an embodiment, the light emitting element layer LDL may include light emitting elements LD which emit light of a first color. For example, each of the light emitting elements LD may be a blue light emitting diode which emits light of a blue color.

However, the light emitting element layer LDL is not limited thereto, and the light emitting element layer LDL may include, for example, a first light emitting element arranged in a first sub-pixel area SPA1, a second light emitting element arranged in a second sub-pixel area SPA2, and a third light emitting element arranged in a third sub-pixel area SPA3. At least two of the first to third sub-pixels SPX1, SPX2, and SPX3 may emit light of different colors.

The light emitting elements LD may be electrically connected to each other in parallel through the first and second electrodes ELT1 and ELT2 in a corresponding sub-pixel area SPA.

The light emitting elements LD may be disposed between the first and second electrodes ELT1 and ELT2. Each of the light emitting elements LD may be disposed between the first and second electrodes ELT1 and ELT2 and the first insulating layer INS1, a first end of each of the light emitting elements LD may electrically contact or be electrically connected to the first electrode ELT1, and a second end thereof may electrically contact or be electrically connected to the second electrode ELT2.

The light emitting elements LD arranged in each sub-pixel area SPA may form a light source of the corresponding sub-pixel SPX. In an example, in case that a driving current flows through at least one sub-pixel SPX during each frame period, light with luminance corresponding to the driving current may be emitted while the light emitting elements LD electrically connected to each other in a forward direction between the first and second electrodes ELT1 and ELT2 of the sub-pixel SPX emit light.

The first electrode ELT1 and the second electrode ELT2 may be arranged in each sub-pixel area SPA and spaced apart from each other and may be arranged such that at least portions thereof face each other. The shapes and arrangement relationship of the first and second electrodes ELT1 and ELT2 may be substantially identical or similar to those of the first and second common electrodes AELT1 and AELT2.

In embodiments, at least one of the first electrode ELT1 and the second electrode ELT2 may be separated from the first and second common electrodes AELT1 and AELT2 and may be electrically disconnected or isolated from the first and second common electrodes AELT1 and AELT2 by the first insulating layer INS1 (or the insulating layer). In case that a voltage (e.g., an alternating current (AC) voltage) for aligning the light emitting elements LD is applied to the first and second common electrodes AELT1 and AELT2, the light emitting elements LD electrically connected between the first and second electrodes ELT1 and ELT2 may be prevented from being damaged by the voltage. However, the disclosure is not limited thereto, and, for example, the first electrode ELT1 may be electrically disconnected from the first common electrode AELT1, but the second electrode ELT2 may be electrically connected to the second common electrode AELT2.

In embodiments, the first electrode ELT1 may include at least one first sub-electrode ELT_S1, and the second electrode ELT2 may include at least one second sub-electrode ELT_S2. The first sub-electrode ELT_S1 and the second sub-electrode ELT_S2 may extend in the first direction DR1 in a sub-pixel area SPA and may be arranged in parallel in the second direction DR2 while being spaced apart from each other by a predetermined interval.

The first sub-electrode ELT_S1 may overlap the branch electrodes of the first common electrode AELT1, and the second sub-electrode ELT_S2 may overlap the branch electrodes of the second common electrode AELT2. The first sub-electrode ELT_S1 may have a line width identical to that of the branch electrodes of the first common electrode AELT1 and may fully overlap the first common electrode AELT1. Similarly, the second sub-electrode ELT_S2 may have a line width identical to that of the branch electrodes of the second common electrode AELT2 and may fully overlap the second common electrode AELT2.

In embodiments, the first electrode ELT1 may further include a first connection electrode CNL1 electrically connected to the first sub-electrode ELT_S1. For example, the first connection electrode CNL1 may extend in the second direction DR2 and may be integral with the first sub-electrode ELT_S1. For example, the first sub-electrode ELT_S1 may branch off from the first connection electrode CNL1 into at least one part. In case that the first sub-electrode ELT_S1 and the first connection electrode CNL1 are integral with each other, the first connection electrode CNL1 may be regarded as an area of the first electrode ELT1. However, the disclosure is not limited thereto. For example, in an embodiment, the first sub-electrode ELT_S1 and the first connection electrode CNL1 may be separately formed and may be electrically connected to each other through at least one contact hole or at least one via hole, which is not illustrated.

The first connection electrode CNL1 may overlap the stem electrode of the first common electrode AELT1, but the disclosure is not limited thereto. For example, the first connection electrode CNL1 may have a line width different from that of the first common electrode AELT1 and may partially overlap the first common electrode AELT1 or may not overlap the first common electrode AELT1. The first connection electrode CNL1 may be independently arranged in each of the sub-pixel areas SPA1, SPA2, and SPA3.

Similarly, the second electrode ELT2 may further include a second connection electrode CNL2 electrically connected to the second sub-electrode ELT_S2. Since the arrangement of the second connection electrode CNL2 and the connection relationship with the second sub-electrode ELT_S2 are substantially the same as the arrangement of the first connection electrode CNL1 and the connection relationship with the first sub-electrode ELT_S1, repetitive descriptions thereof will be omitted. The second connection electrode CNL2 may extend from the corresponding sub-pixel area SPA to other sub-pixel areas SPA.

In an embodiment, the first electrode ELT1 may be formed on first ends of the light emitting elements LD and may be physically and/or electrically connected to the first ends of the light emitting elements LD. Similarly, the second electrode ELT2 may be formed on second ends of the light emitting elements LD and may be physically and/or electrically connected to the second ends of the light emitting elements LD.

The first and second electrodes ELT1 and ELT2 may include one or more metal materials selected from the group consisting of aluminum (Al), titanium (Ti), indium (In), gold (Au), and silver (Ag), or one or more transparent materials selected from the group consisting of indium tin oxide (ITO), ZnO:Al, and a carbon nano tube (CNT)-conducting polymer composite. In case that the first and second electrodes ELT1 and ELT2 include two or more types of electrode-forming materials, the first and second electrodes ELT1 and ELT2 may have a structure in which the two or more types of electrode-forming materials are stacked.

A color conversion layer CCL (or a photo-conversion layer) may include a second insulating layer INS2 and color conversion materials (or color conversion elements) QR1 and QR2. However, the disclosure is not limited thereto, and the second insulating layer INS2 may be included in the light emitting element layer LDL.

The second insulating layer INS2 may be disposed on the light emitting element layer LDL. For example, the second insulating layer INS2 may cover or overlap at least a portion of each of the first and second electrodes ELT1 and ELT2 or may be disposed on the overall surface of the light emitting element layer LDL. Since the second insulating layer INS2 and the first insulating layer INS1 may be substantially the same, repetitive descriptions thereof will be omitted. Although FIG. 4 illustrates that the second insulating layer INS2 is not arranged in the first sub-pixel area SPA1, this is intended to expose the first and second electrodes ELT1 and ELT2 and the light emitting elements LD which are arranged in the first sub-pixel area SPA1, and the second insulating layer INS2 may also be arranged in the first sub-pixel area SPA1.

Color conversion elements QR1 and QR2 may be disposed on the second insulating layer INS2 in some of the sub-pixel areas SPA1, SPA2, and SPA3. For example, first color conversion elements QR1 may be disposed on the second insulating layer INS2 in the second sub-pixel area SPA2, and second color conversion elements QR2 may be disposed on the second insulating layer INS2 in the third sub-pixel area SPA3.

Each of the first and second color conversion elements QR1 and QR2 may shift light in a first wavelength band, emitted by each of the light emitting elements LD, to a second wavelength band, and for example, may convert light of a first color into light of a second color and emit the light of the second color.

In some embodiments, each of the first and second color conversion elements QR1 and QR2 may have a rod shape and may be, for example, a quantum rod. Here, as described above, the rod shape may embrace a rod-like shape or a bar-like shape such as a cylindrical or prismatic shape, which is longer in a longitudinal direction than in the widthwise direction (for example, having an aspect ratio greater than 1), and the cross-sectional shape thereof is not particularly limited. The structures of the first and second color conversion elements QR1 and QR2 will be described below with reference to FIG. 7.

In some embodiments, the first and second color conversion elements QR1 and QR2 may be aligned (or arranged) in the second direction DR2, and a second alignment direction ADR2 of the first and second color conversion elements QR1 and QR2 may be substantially identical to or aligned with a first alignment direction ADR1 of the light emitting elements LD. Here, similar to the above-described first alignment direction ADR1, the second alignment direction ADR2 may be a direction in which the major axes of the first and second color conversion elements QR1 and QR2 face on average, for example, a direction which 70% or more of the first and second color conversion elements QR1 and QR2 face.

In an embodiment, the first color conversion element QR1 may convert light of a first color, emitted by the light emitting elements LD, into light of a second color, and the second color conversion element QR2 may convert light of the first color into light of a third color. For example, in case that the light emitting elements LD emit light of a blue color, the first color conversion element QR1 may be a first color quantum rod (or a green quantum rod) for converting light of a blue color into light of a green color, and the second color conversion element QR2 may be a second color quantum rod (or a red quantum rod) for converting light of a blue color into light of a red color. The light of a blue color may be emitted from the first the first sub-pixel area SPA1, light of a green color may be emitted from the second sub-pixel area SPA2, and light of a red color may be emitted from the third sub-pixel area SPA3. Therefore, a full color pixel PXL may be implemented.

As described above with reference to FIGS. 4 to 6, the light emitting device EU (or the pixel PXL) according to embodiments may include rod-type light emitting elements LD and rod-type color conversion elements QR1 and QR2 (or quantum rods), but the second alignment direction ADR2 of the color conversion elements QR1 and QR2 may be substantially identical or aligned with the first alignment direction ADR1 of the light emitting elements LD. Light linearly polarized by the rod-type light emitting elements LD may be maximally absorbed in the color conversion elements QR1 and QR2 arranged in a same direction, and thus the emission efficiency of the light emitting device EU may be maximized.

Figure 7:
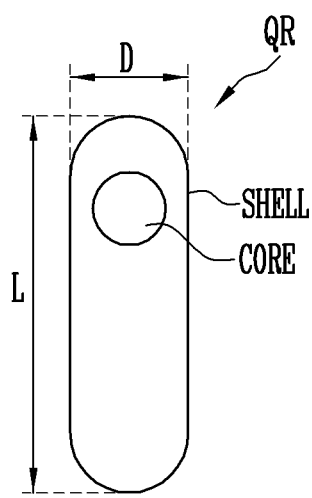
FIG. 7 is a view schematically illustrating an example of a color conversion element included in the light emitting device of FIG. 4.

FIG. 7 is a schematic view illustrating an example of the color conversion element included in the light emitting device of FIG. 4. In embodiments, a color conversion element QR may be a quantum rod.

Referring to FIG. 7, the color conversion element QR may include a core CORE and a shell SHELL.

The core CORE of the color conversion element QR may have a shape corresponding to one of a sphere, an elliptical sphere, a polyhedron, and a rod.

The shell SHELL may enclose the core CORE and may have a form having a major axis and a minor axis. The ratio of the minor axis (or diameter D) to the major axis (or length L) of the shell SHELL may range from about 1:1.1 to about 1:30. In case that the color conversion element QR is cut in the direction of the minor axis, a cut surface of the shell SHELL may have a shape corresponding to one of a circle, an ellipse, and a polygon.

In an embodiment, the length L of the color conversion element QR may be substantially identical to or less than the length of the light emitting elements LD. As will be described below, the color conversion element QR may be arranged in response to an electric field formed between the first and second common electrodes AELT1 and AELT2. In case that the length L of the color conversion element QR is less than or equal to the length of the light emitting elements LD (or an interval between the first and second common electrodes AELT1 and AELT2), the arrangement efficiency of the color conversion element QR (e.g., a desired ratio of color conversion elements QR arranged in a second alignment direction ADR2) may be improved.

In embodiments, the shell SHELL may have a single-layer or multi-layer structure. The shell may be formed of an alloy, an oxide-based material, or a material doped with impurities.

The core CORE may be made of a material corresponding to Groups II-VI, III-V, VI-IV or IV semiconductors in the periodic table, or an alloy or mixture thereof. For example, in case that the core CORE of the color conversion element QR is made of a Group II-VI material, the core CORE of the color conversion element QR may be made of (or include) a material corresponding to one of CdSe, CdS, CdTe, ZnO, ZnSe, ZnS, ZnTe, HgSe, HgTe, and CdZnSe, or a mixture of two or more thereof. In an example, in case that the core CORE of the color conversion element QR is made of a Group III-V material, the core CORE of the color conversion element QR may be made of a material corresponding to one of InP, InN, GaN, InSb, InAsP, InGaAs, GaAs, GaP, GaSb, AlP, AlN, AlAs, AlSb, or a mixture of two or more thereof. In a further embodiment, in case that the core CORE of the color conversion element QR is made of a Group VI-IV material, the core CORE of the color conversion element QR may be made of a material corresponding to one of PbSe, PbTe, PbS, PbSnTe, Tl$_2$SnTe$_5$, or a mixture of two or more thereof.

Even if the core CORE is formed of a same material, the fluorescent wavelength of the color conversion element QR may change depending on the size of the core CORE. For example, as the size of the core CORE is smaller, light having a shorter wavelength may be emitted, and as the size of the core CORE is greater, light having a longer wavelength may be emitted.

In embodiments, in case that no electric field is applied to the color conversion element QR, electrons and holes may be kept combined with each other in the core CORE. In case that an electric field is applied to the color conversion element QR, electrons and holes may be spatially separated from each other either in the core CORE or between the core CORE and the shell SHELL, thereby resulting in polarization in the color conversion element QR. For example, in case that the color conversion element QR is located in the electric field, the color conversion element QR may be aligned or arranged in a specific direction depending on the polarization of the color conversion element QR and the direction of the electric field.

Figure 8:
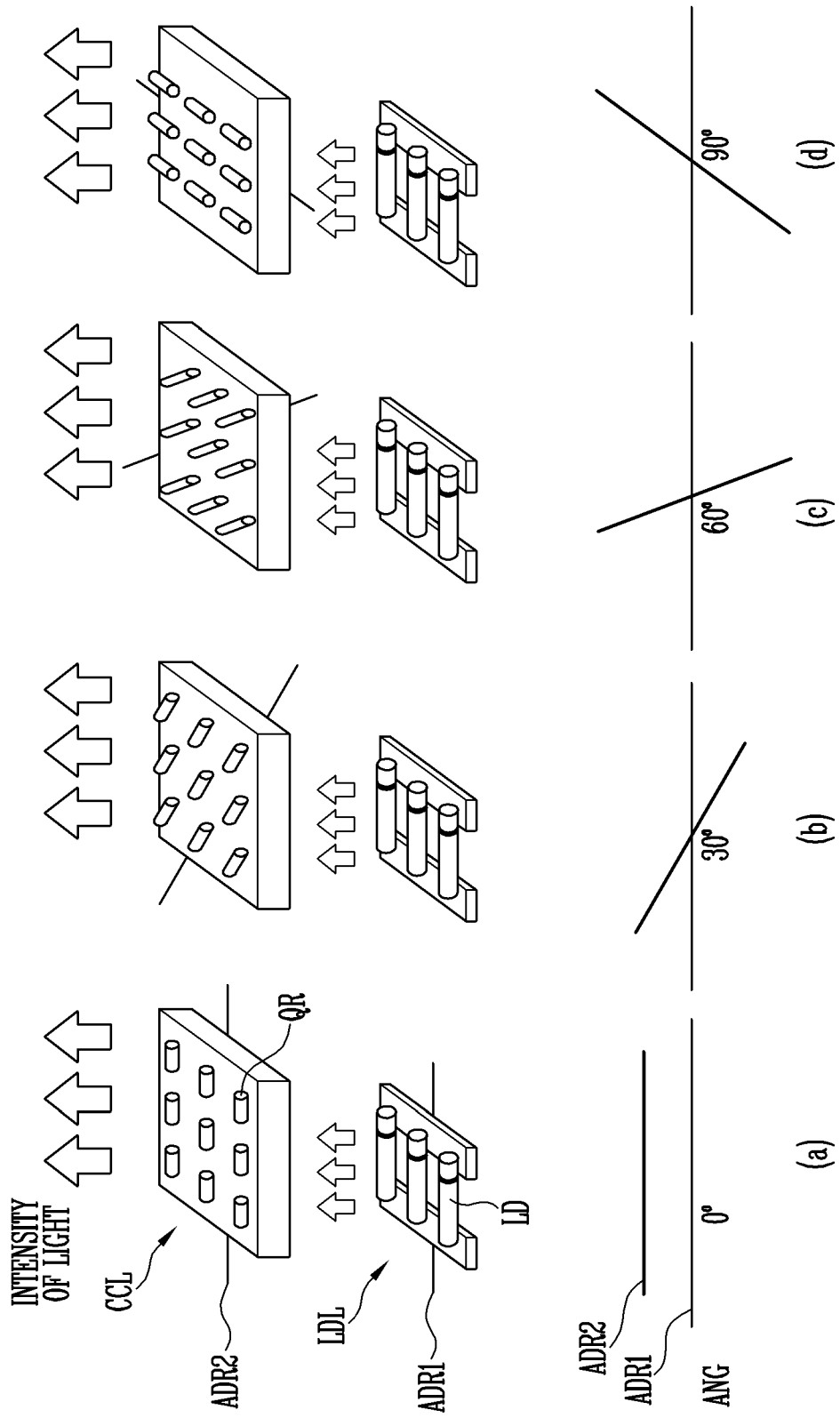
FIGS. 8 and 9 are views schematically illustrating emission efficiency depending on an alignment relationship between light emitting elements and color conversion elements included in the light emitting device of FIG. 4.
Figure 9:
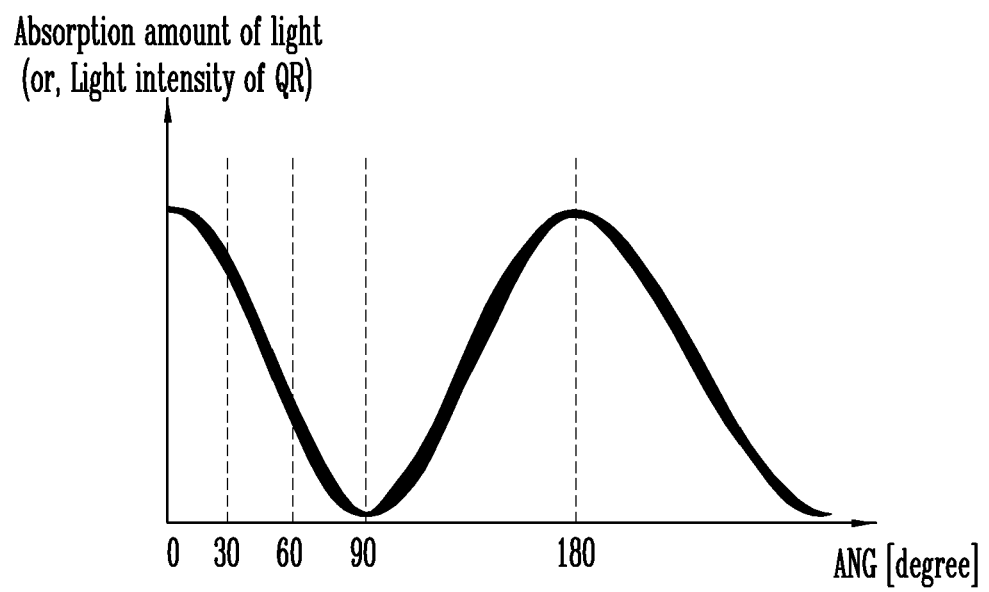

FIGS. 8 and 9 are schematic views illustrating emission efficiency depending on an alignment relationship between light emitting elements and color conversion elements included in the light emitting device of FIG. 4. FIG. 8 illustrates an angle ANG (or an arrangement angle) of the second alignment direction ADR2 of the color conversion elements QR with respect to the first alignment direction ADR1 of the light emitting elements LD. FIG. 9 illustrates the amount of light absorbed in each color conversion element QR (or intensity of light emitted from the color conversion element QR) depending on the angle of the second alignment direction ADR2 of the color conversion element QR.

First, referring to FIG. 8, the light emitting elements LD included in a light emitting element layer LDL may be aligned in the first alignment direction ADR1, and the color conversion elements QR included in a color conversion layer CCL may be aligned in the second alignment direction ADR2. The angle ANG may be an angle of the second alignment direction ADR2 with respect to the first alignment direction ADR1.

In embodiments, the second alignment direction ADR2 of the color conversion elements QR may form an acute angle of about 30 or less degrees with respect to the first alignment direction ADR1 of the light emitting elements LD or may be parallel to the first alignment direction ADR1. For example, the angle ANG may have a range from about 0 to about 30 degrees. For example, the second alignment direction ADR2 may form an acute angle of about 15 or less degrees with respect to the first alignment direction ADR1. In an example, the second alignment direction ADR2 may be parallel to the first alignment direction ADR1.

Referring to FIG. 9, the light absorbed in the color conversion elements QR (or the intensity of light emitted from the color conversion elements QR) may be changed to the form of a sine wave depending on the angle ANG between the light emitting elements LD and the color conversion elements QR. Accordingly, as the angle ANG between the light emitting elements LD and the color conversion elements QR becomes closer to about 0, the amount of light absorbed in the color conversion elements QR may be increased, and the intensity of light emitted from the color conversion elements QR may be increased.

Therefore, in case that the angle ANG between the light emitting elements LD and the color conversion elements QR is less than or equal to a specific value, the emission efficiency (or color conversion efficiency) of the color conversion elements QR may be greatly improved. The light emitted from the color conversion elements QR and the light emitted by the light emitting elements LD may be light polarized in a same direction. Therefore, the light emitting device EU (see FIG. 4) enabling the output of polarized light may maximize the efficiency of a black polarizing film that is additionally attached thereto, and may allow a high-contrast display device to be implemented.

FIGS. 10A to 10H are schematic views illustrating a process of manufacturing the light emitting device of FIG. 4.

Figure 10A:
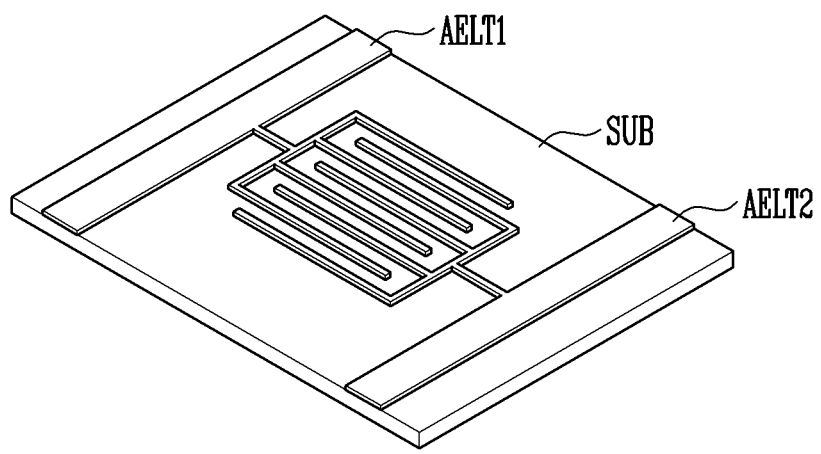
FIGS. 10A to 10H are views schematically illustrating a process of manufacturing the light emitting device of FIG. 4.

Referring to FIGS. 4 and 10A, first and second common electrodes AELT1 and AELT2 (or a common electrode layer AEL) may be formed on a substrate SUB (or in a sub-pixel area SPA of the substrate SUB).

The area and shape of the substrate SUB are not limited and may vary in consideration of the area of the first and second common electrodes AELT1 and AELT2 to be formed on the substrate SUB, the size of light emitting elements LD, the number of light emitting elements LD to be mounted, or the like. The thickness of the substrate SUB may be about 100 μm to about 1 mm. The areas (or unit electrode areas) of the first and second common electrodes AELT1 and AELT2 may be about 10 μm² to about 100 cm².

Figure 10B:
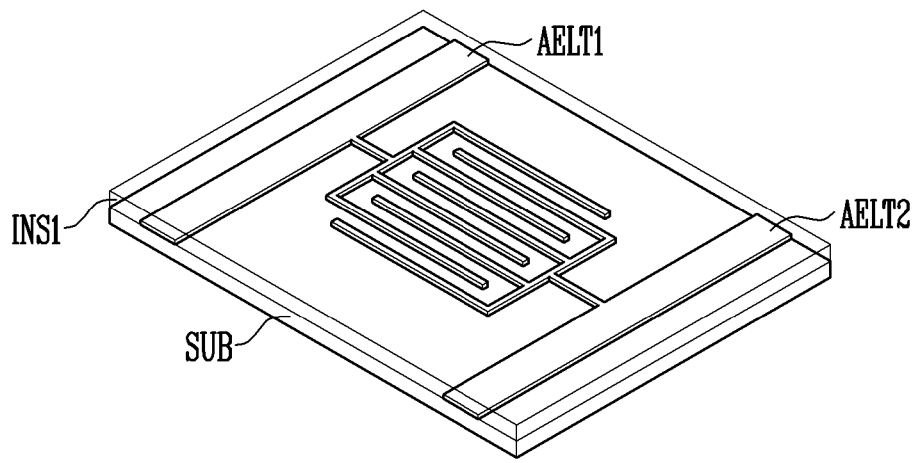

As illustrated in FIG. 10B, a first insulating layer INS1 may be formed on the first and second common electrodes AELT1 and AELT2.

In an embodiment, the first insulating layer INS1 may be formed by one of plasma enhanced chemical vapor deposition (PECVD), e-beam deposition, atomic layer deposition, and sputtering deposition, but the disclosure is not limited thereto.

The first insulating layer INS1 may include at least one material selected from among $SiO_2$, $Si_3N_4$, $SiN_x$, $Al_2O_3$, $HfO_2$, $Y_2O_3$, and $TiO_2$. The first insulating layer INS1 may have a thickness of about 1 nm to about 100 μm, which may vary in accordance with the voltage (e.g., an alignment voltage) of a power supply applied to the first and second common electrodes AELT1 and AELT2, the length of the light emitting elements LD, a distance between the first and second common electrodes AELT1 and AELT2, or the like.

Figure 10C:
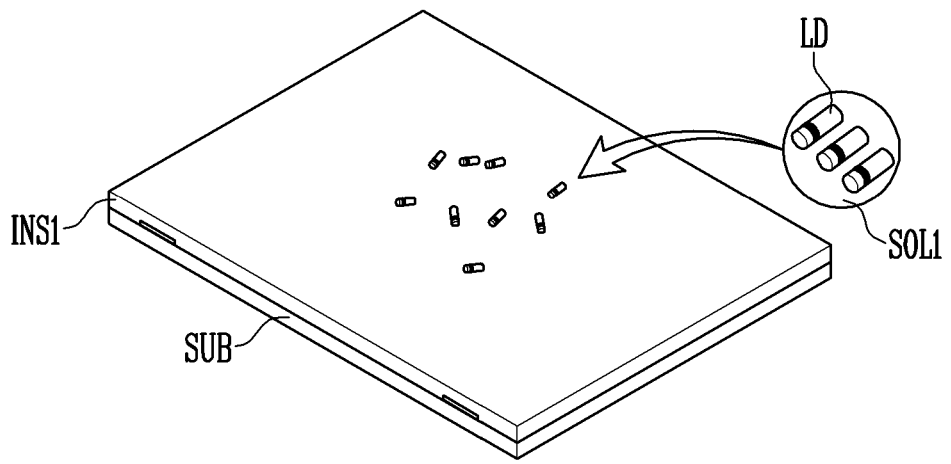

As illustrated in FIG. 10C, the light emitting elements LD may be provided in a diffused form in a first solution SOL1 and may be provided on the first insulating layer INS1.

The first solution SOL1 may be manufactured by mixing the light emitting elements LD with a dispersion solvent. The dispersion solvent may be the form of ink or paste, and the solvent may be, as a volatile solvent, at least one selected from among acetone, water, alcohol, and toluene. However, the type of dispersion solvent is not limited to the above-described type, and any type of solvent may be used without limitation as long as the solvent may be readily evaporated without exerting physical and chemical influences on the light emitting elements LD. The first solution SOL1 may include 0.001 to 100 weight % of the light emitting elements LD, based on the total weight of the dispersion solvent. In case that the first solution SOL1 includes light emitting elements LD corresponding to less than 0.001 weight %, the number of light emitting elements LD electrically connected to the electrodes (e.g., first and second electrodes ELT1 and ELT2) may be small. In contrast, in case that the first solution SOL1 includes light emitting elements LD corresponding to more than 100 weight %, the alignment of the light emitting elements LD may be interrupted.

Figure 10D:
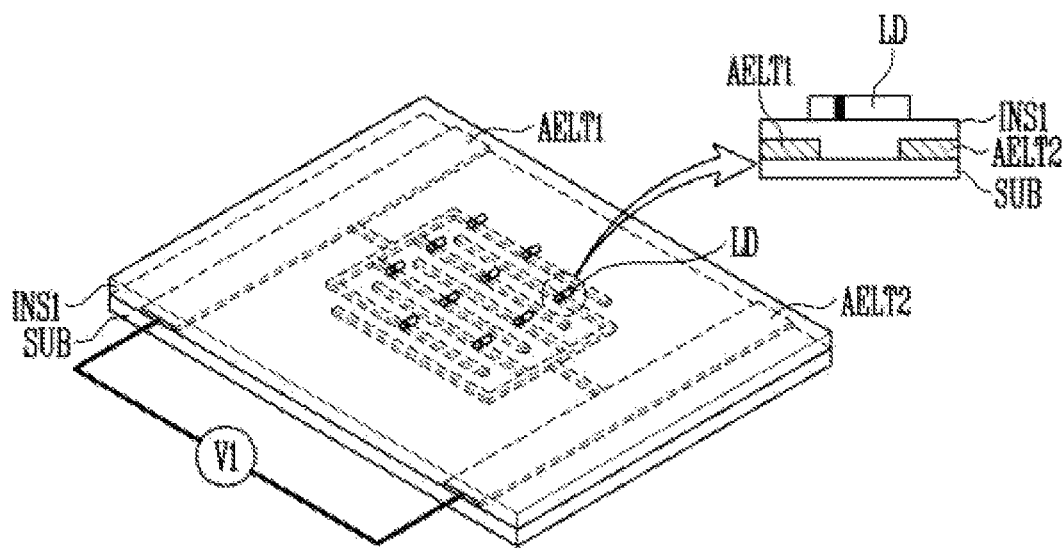

As illustrated in FIG. 10D, in case that a predetermined voltage is supplied to the first and second common electrodes AELT1 and AELT2, an electric field may be formed between the first and second common electrodes AELT1 and AELT2, and the light emitting elements LD may be self-aligned between the first and second common electrodes AELT1 and AELT2 in a plan view. In case that the light emitting elements LD have been aligned, the solvent may be volatilized or removed using other additional methods, and thus the light emitting elements LD may be stably arranged on the first insulating layer INS1.

For example, in case that a first voltage V1 is supplied between the first and second common electrodes AELT1 and AELT2, an electric field may be formed between the first and second common electrodes AELT1 and AELT2, and thus polarization may occur in the light emitting elements LD. Accordingly, the light emitting elements LD may be arranged with an orientation tendency by an electrostatic attraction between adjacent first and second common electrodes AELT1 and AELT2. In case that the first common electrode AELT1 is a positive pole and the second common electrode AELT2 is a negative pole, first ends of the light emitting elements LD having negative charges may be disposed on the first insulating layer INS1 in accordance with the position of the first common electrode AELT1, and second ends thereof having positive charges may be disposed on the first insulating layer INS1 in accordance with the position of the second common electrode AELT2.

In embodiments, the first voltage V1 may have a voltage level of about 0.1 V to about 2000 V. In case that the voltage level of the first voltage V1 is less than 0.1 V, the alignment efficiency of the light emitting elements LD may be deteriorated. In case that the voltage level of the first voltage V1 is greater than 2000 V, the first insulating layer INS1 may be broken, and thus a leakage current, an electrical short-circuit, or an electrode damage may occur. The frequency of the first voltage V1 may range from about 10 Hz to about 100 GHz, and the first voltage V1 may be, for example, a sine wave having a frequency of about 90 kHz to about 100 MHz. In case that the frequency is less than 10 Hz, the number of light emitting elements LD that are mounted may be greatly decreased, and the orientation of the light emitting elements LD may be very irregular. In case that the frequency is greater than 100 GHz, the light emitting elements LD may not adapt to rapidly changing AC power, and thus the mountability of the light emitting elements LD may be decreased, and orientation tendency may also be decreased.

Figure 10E:
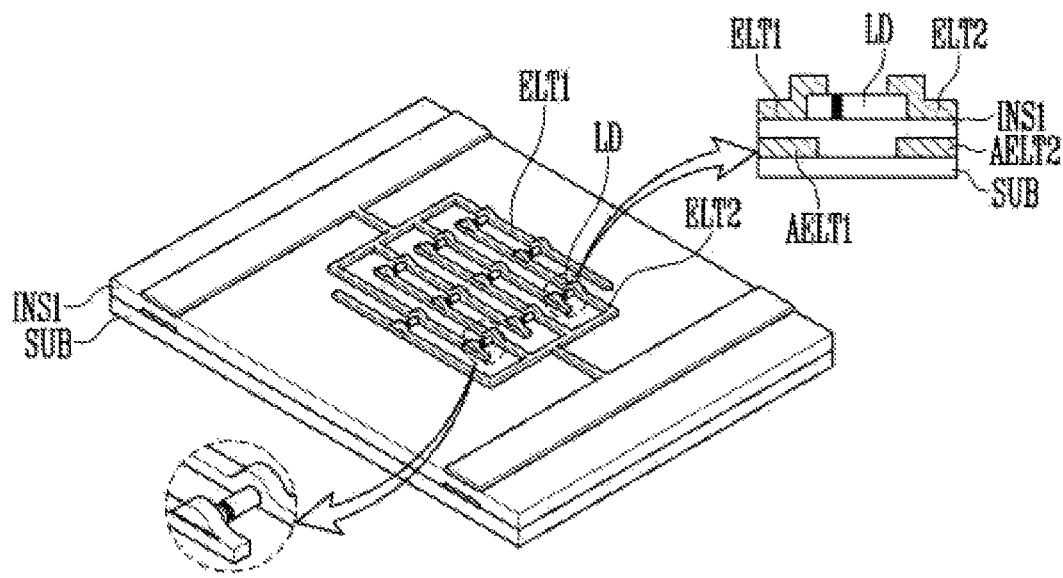

As illustrated in FIG. 10E, a first electrode ELT1 and a second electrode ELT2 may be respectively formed on the opposite ends of each of the light emitting elements LD. The light emitting elements LD may be stably connected between the first and second electrodes ELT1 and ELT2. A process of forming the first and second electrodes ELT1 and ELT2 will be described below with reference to FIGS. 11A to 11E.

Figure 10F:
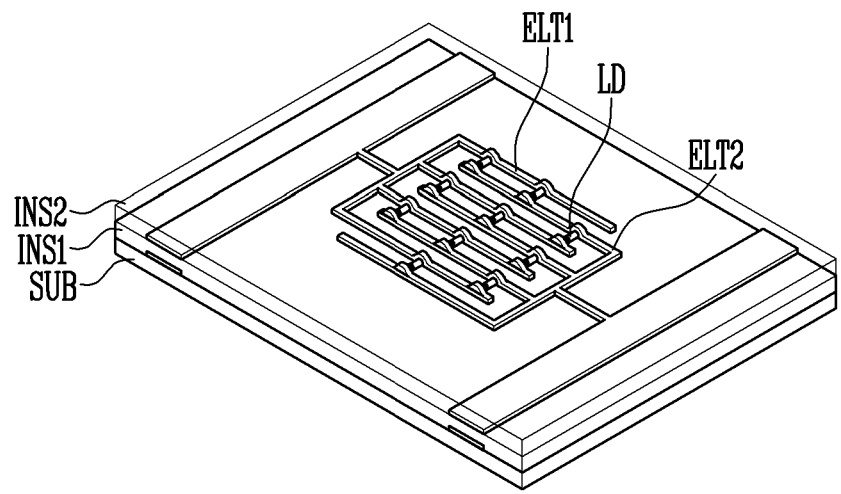

As illustrated in FIG. 10F, a second insulating layer INS2 may be formed on the light emitting element layer LDL (for example, the first insulating layer INS1, the light emitting elements LD, and the first and second electrodes ELT1 and ELT2). A method of forming the second insulating layer INS2 may be substantially identical or similar to the method of forming the first insulating layer INS1.

Figure 10G:
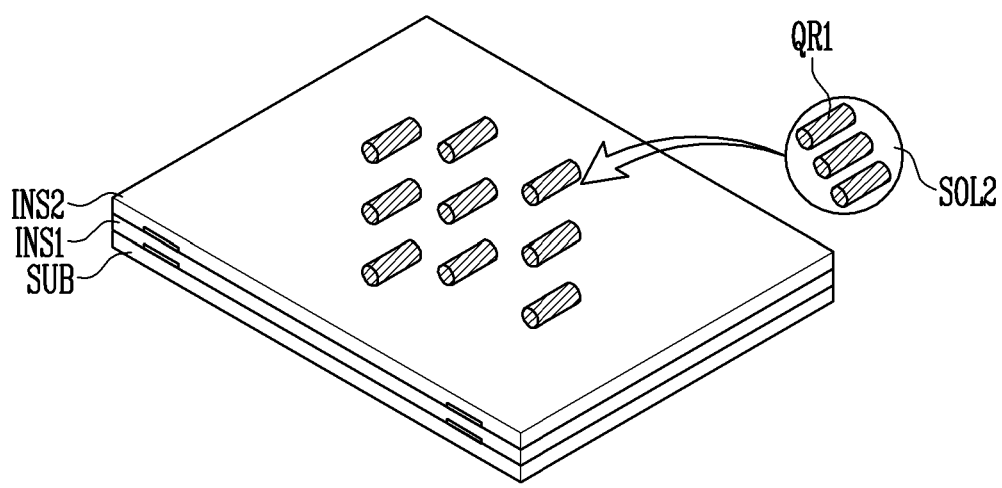

As illustrated in FIG. 10G, color conversion elements QR may be provided in a diffused form in a second solution SOL2 and may be provided on the second insulating layer INS2. For example, a first color conversion element QR1 may be provided on the second insulating layer INS2 in the second sub-pixel area SPA2 (see FIG. 4), and a second color conversion element QR2 may be provided on the second insulating layer INS2 in the third sub-pixel area SPA3 (see FIG. 4).

Figure 10H:
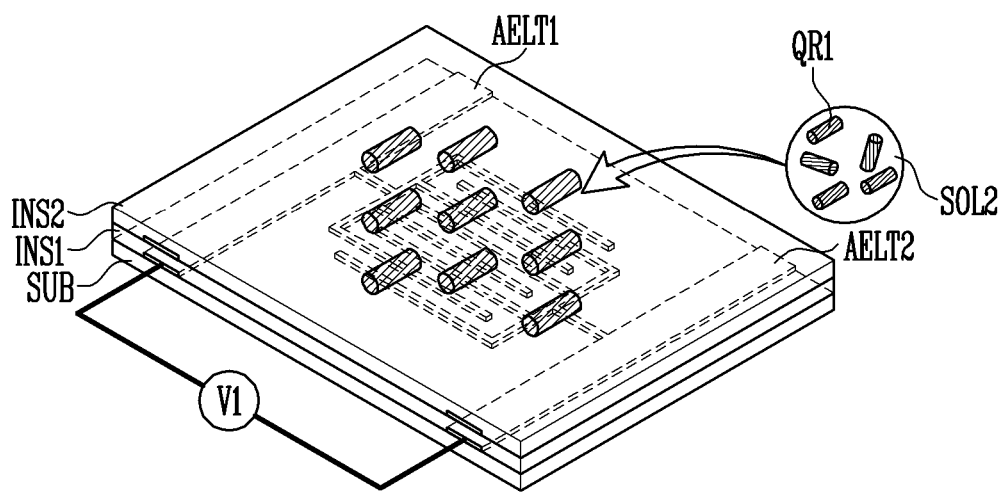

Therefore, as illustrated in FIG. 10H, in case that a first voltage V1 is supplied to the first and second common electrodes AELT1 and AELT2, an electric field may be formed between the first and second common electrodes AELT1 and AELT2, and then the color conversion elements QR (e.g., the first color conversion elements QR1) may be self-aligned between the first and second common electrodes AELT1 and AELT2 in a plan view. Although not illustrated in the drawings, a separate conductive layer (or an overcoat layer) may be formed on the second insulating layer INS2 and may cover or overlap the color conversion elements QR.

Although FIGS. 10G and 10H illustrate that the color conversion elements QR are sequentially provided and aligned, the disclosure is not limited thereto. For example, the color conversion elements QR may be simultaneously provided and aligned. For example, the first color conversion elements QR1 may be simultaneously provided and aligned in a second sub-pixel area SPA2, and the second color conversion elements QR2 may be simultaneously provided and aligned in a third sub-pixel area SPA3.

FIGS. 11A to 11E are schematic views illustrating a process of forming first and second electrodes of FIG. 10E. FIGS. 11A to 11E illustrate, as a common electrode layer AEL, a configuration (e.g., a substrate SUB, an additional light emitting element layer, etc.) disposed under the first and second electrodes ELT1 and ELT2.

Figure 11A:
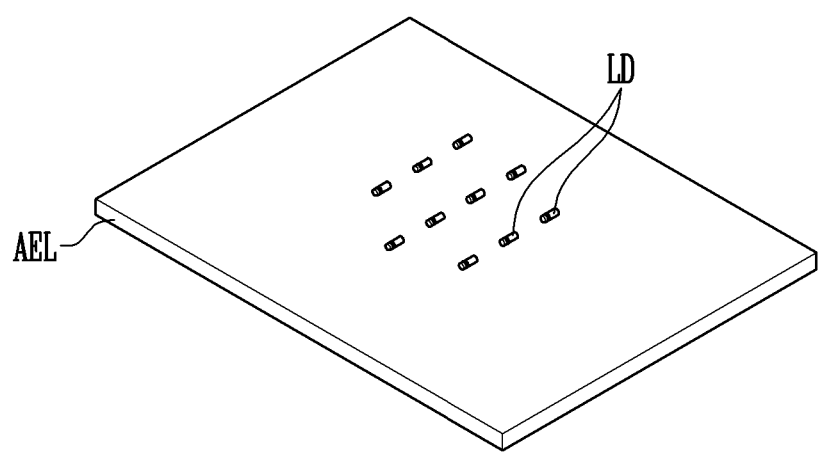
FIGS. 11A to 11E are views schematically illustrating a process of forming first and second electrodes of FIG. 10E.

First, referring to FIGS. 10E and 11A, a common electrode layer AEL having a surface on which light emitting elements LD are aligned may be provided.

Figure 11B:
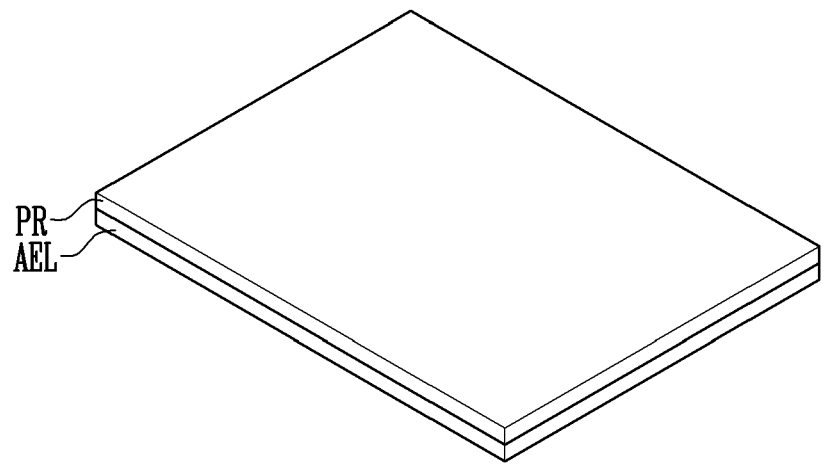

As illustrated in FIG. 11B, the common electrode layer AEL may be coated with a photoresist, or in another example, a photoresist layer PR may be formed on the common electrode layer AEL The photoresist layer PR may include a photoresist that is used in the art. The common electrode layer AEL may be coated with a photoresist by one of spin coating, spray coating, and screen printing. The thickness of the photoresist layer PR may be changed in consideration of the thickness of the first and second electrodes ELT1 and ELT2 to be formed on the common electrode layer AEL and may be, for example, about 0.1 μm to about 10 μm. However, the disclosure is not limited thereto.

Figure 11C:
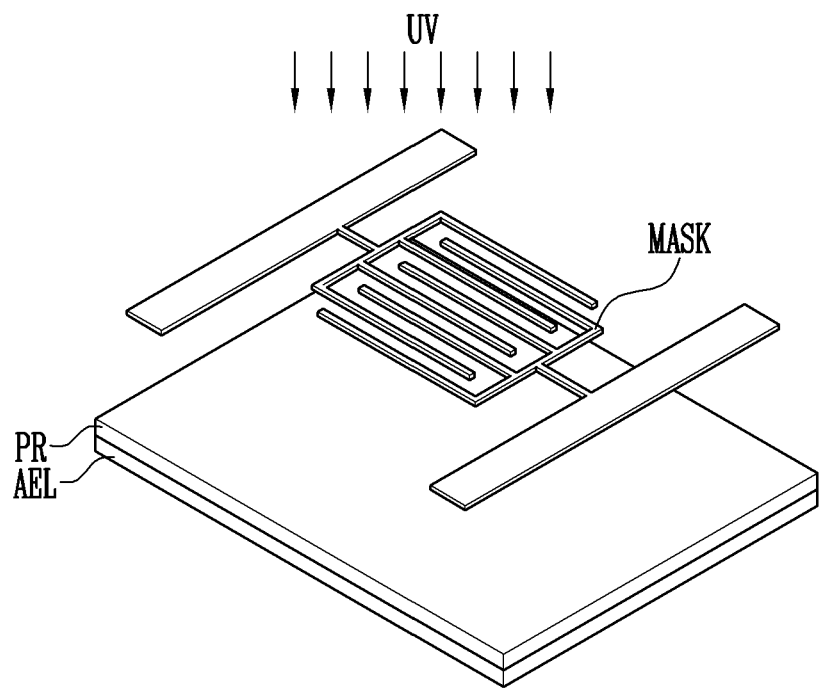

As illustrated in FIG. 11C, a mask MASK in which a pattern corresponding to the first and second electrodes ELT1 and ELT2 is printed may be disposed on the photoresist layer PR, and the top of the mask MASK may be exposed to ultraviolet rays (or ultraviolet radiation).

Figure 11D:
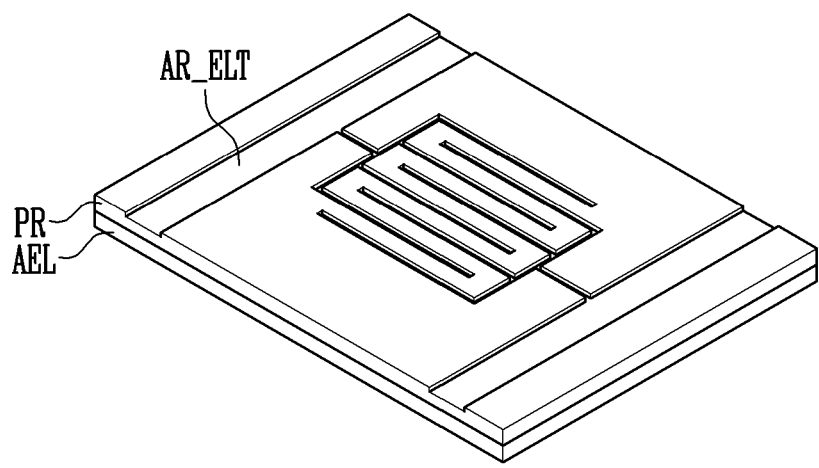

As illustrated in FIG. 11D, the photoresist layer PR may be immersed in a typical photoresist solvent, and thus an exposed portion AR_ELT of the photoresist layer PR may be removed. For example, the portion AR_ELT of the photoresist layer PR, in which the first and second electrodes ELT1 and ELT2 are to be formed, may be removed.

Figure 11E:
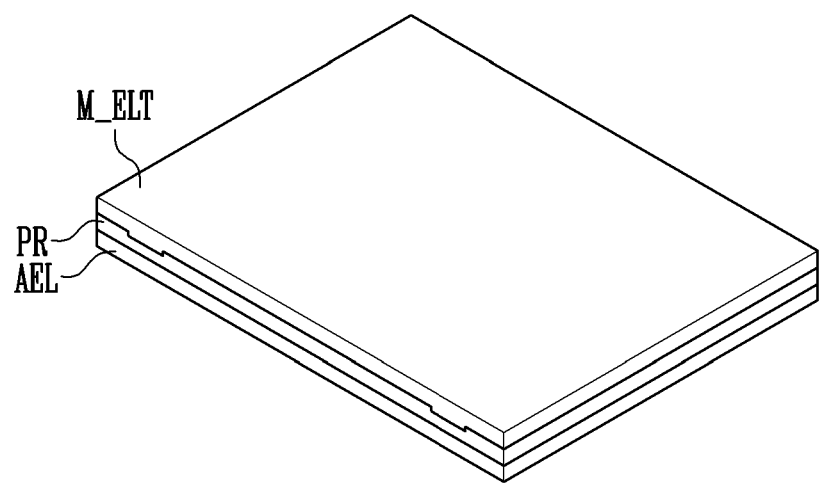

As illustrated in FIG. 11E, an electrode forming material M_ELT may be deposited on the photoresist layer PR. The electrode forming material M_ELT and the material forming the first and second electrodes ELT1 and ELT2 may be the same.

After the electrode forming material M_ELT has been deposited, the photoresist layer PR formed on the common electrode layer AEL may be removed using a photoresist remover. Here, the photoresist remover may be one of acetone, N-methyl pyrrolidone (1-Methyl-2-pyrrolidone (NMP)), and dimethyl sulfoxide (DMSO).

As the photoresist layer PR is removed, first and second electrodes ELT1 and ELT2 may be formed on the common electrode layer AEL.

Although FIGS. 11A to 11E illustrate that the first and second electrodes ELT1 and ELT2 are manufactured, the disclosure is not limited thereto. The manufacturing method in FIGS. 11A to 11E may also be applied to first and second common electrodes AELT1 and AELT2. For example, the first and second common electrodes AELT1 and AELT2 and the first and second electrodes ELT1 and ELT2 may be formed using a same manufacturing method.

Figure 12:
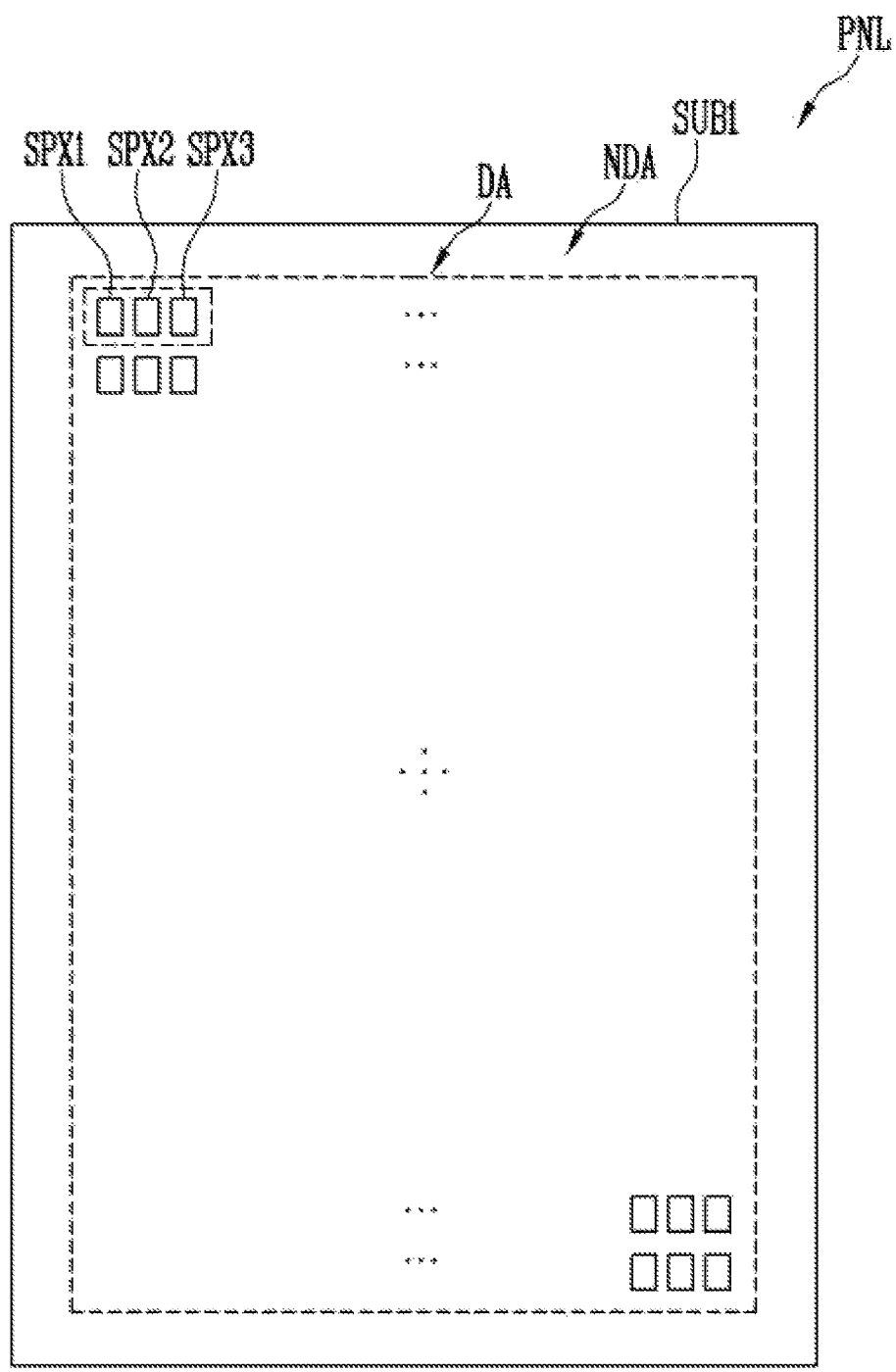
FIG. 12 is a plan view schematically illustrating a display device according to an embodiment of the disclosure.

FIG. 12 is a schematic plan view illustrating a display device according to an embodiment. In an embodiment, FIG. 12 illustrates a display device, especially, a display panel PNL provided in the display device, as an example device that may use the light emitting elements LD, described with reference to FIGS. 1A to 3B, or the light emitting device EU, described with reference to FIG. 4, as a light source. In accordance with an embodiment, FIG. 12 schematically illustrates the structure of the display panel PNL, focusing on a display area DA. However, in some embodiments, at least one driving circuit (e.g., at least one of a scan driver and a data driver), which is not illustrated, and/or lines may be further provided on the display panel PNL.

Referring to FIG. 12, the display panel PNL may include a first substrate SUB1 and pixels PXL including first, second and third sub-pixels SPX1, SPX2, and SPX3 arranged on the first substrate SUB1. In detail, the display panel PNL and the first substrate SUB1 may include a display area DA in which an image is displayed, and a non-display area NDA other than the display area DA.

In an embodiment, the display area DA may be disposed in a central portion of the display panel PNL, and the non-display area NDA may be disposed along a perimeter portion of the display panel PNL to enclose the display area DA. However, the positions of the display area DA and the non-display area NDA are not limited thereto and may be changed.

The first substrate SUB1 may form abase member of the display panel PNL. For example, the first substrate SUB1 may form a base member of a lower panel (e.g., a lower plate of the display panel PNL). Since the first substrate SUB1 is substantially identical or similar to the substrate SUB described above with reference to FIG. 4, repetitive descriptions thereof will be omitted.

An area of the first substrate SUB1 may be defined as the display area DA in which the pixels PXL are disposed, and the remaining area thereof may be defined as the non-display area NDA. For example, the first substrate SUB1 may include the display area DA including pixel areas in which the pixels PXL are formed, and the non-display area NDA disposed around the display area DA. Various lines and/or internal circuits which are electrically connected to the pixels PXL of the display area DA may be disposed in the non-display area NDA.

Each pixel PXL may include at least one light emitting element LD driven in response to the corresponding scan signal and the corresponding data signal, for example, at least one rod-type light emitting diode according to one of the embodiments in FIGS. 1A to 3B. The rod-type light emitting diodes may form a light source of the pixel PXL.

Further, the pixel PXL may include sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit light of different colors. In an example, the first sub-pixel SPX1 may be a red sub-pixel which emits light of a red color, the second sub-pixel SPX2 may be a green sub-pixel which emits light of a green color, and the third sub-pixel SPX3 may be a blue sub-pixel which emits light of a blue color. However, the colors, types, and/or numbers of sub-pixels forming the pixel PXL are not particularly limited, and in an example, the colors of light emitted from respective sub-pixels may be changed in various manners. Further, although FIG. 12 illustrates an embodiment in which the pixels PXL are arranged in the form of stripes in the display area DA, the disclosure is not limited thereto. For example, the pixels PXL may be arranged in the form of various pixel arrays.

In an embodiment, the pixels PXL may be formed as active pixels. However, the types, structures, and/or driving schemes of the pixels PXL usable in the display device according to the disclosure are not limited to particular types, structures, and/or driving schemes. For example, each pixel PXL may be formed as a pixel of display devices having various passive or active structures.

Figure 13A:
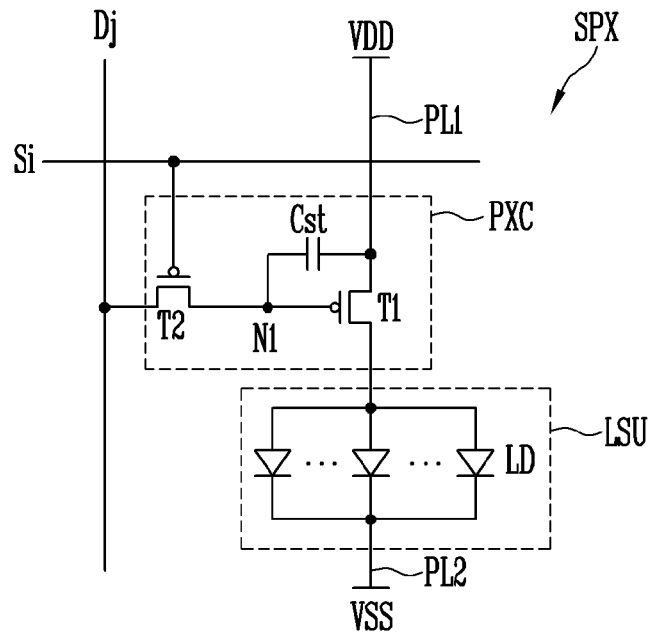
FIGS. 13A to 13C are circuit diagrams schematically illustrating examples of a pixel included in the display device of FIG. 12.
Figure 13B:
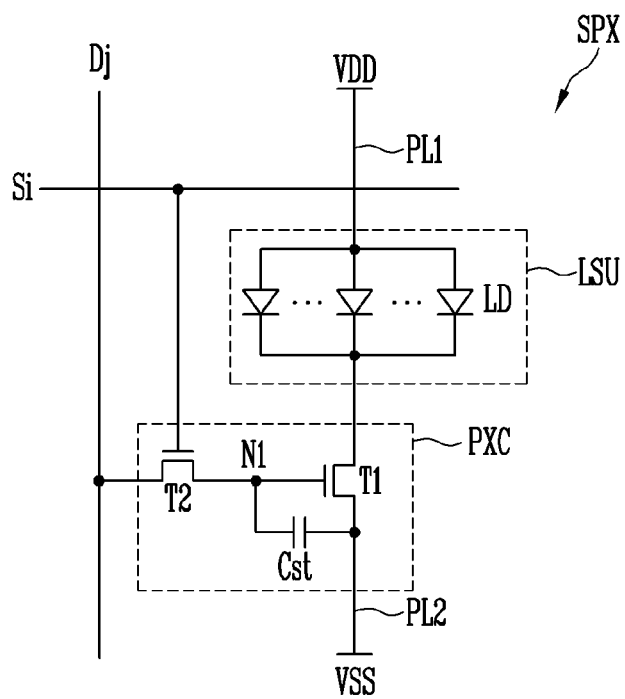
Figure 13C:
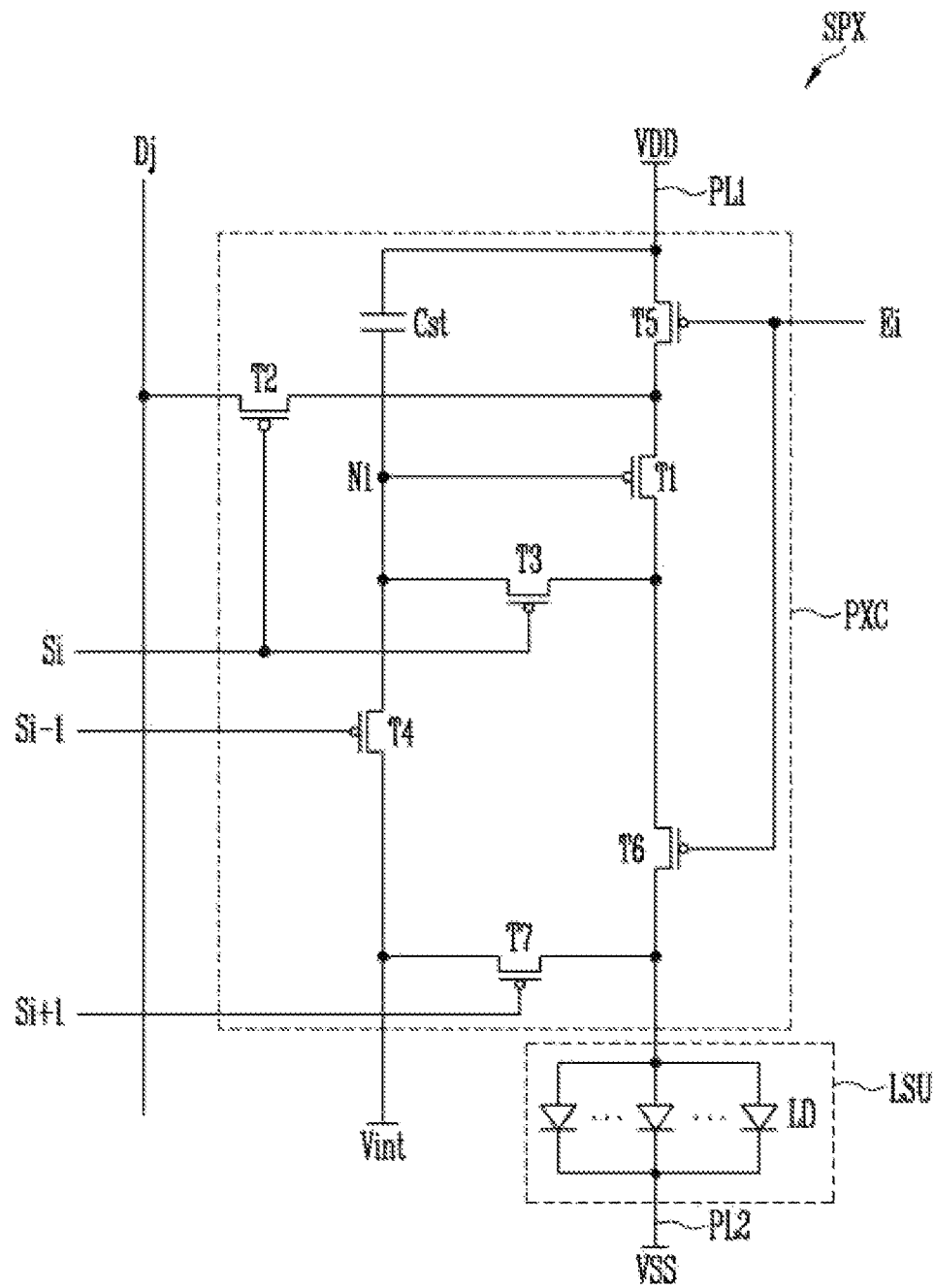

FIGS. 13A to 13C are schematic diagrams of equivalent circuits illustrating examples of a sub-pixel included in the display device of FIG. 12. FIGS. 13A to 13C illustrate one of the first, second, and third sub-pixels SPX1, SPX2, and SPX3 illustrated in FIG. 12. FIGS. 13A to 13C illustrate different embodiments of the sub-pixel SPX that may be provided in an active display device (e.g., an active light emitting display device).

For example, the sub-pixel SPX illustrated in FIGS. 13A to 13C may be one of the first, second, and third sub-pixels SPX1, SPX2, and SPX3 provided on the display panel PNL of FIG. 12, and the first, second, and third sub-pixels SPX1, SPX2, and SPX3 may have a substantially identical or similar structure. Therefore, in FIGS. 13A to 13C, the first, second, and third sub-pixels SPX1, SPX2, and SPX3 may be referred to as a sub-pixel SPX.

First, referring to FIG. 13A, the sub-pixel SPX may include an emission unit LSU and a pixel circuit PXC for driving the emission unit LSU.

In an embodiment, the emission unit LSU may include light emitting elements LD electrically connected in parallel to each other between first and second power supplies VDD and VSS through first and second power lines PL1 and PL2, respectively. Here, the first and second power supplies VDD and VSS may have different potentials. For example, the first power supply VDD may be set as a high-potential power supply, and the second power supply VSS may be set as a low-potential power supply. Here, a potential difference between the first and second power supplies VDD and VSS may be set to a threshold voltage or more of the light emitting elements LD during at least a light emitting period of the sub-pixel SPX.

Although FIG. 13A illustrates that the light emitting elements LD are electrically connected in parallel to each other in a same direction (e.g., a forward direction) between the first power supply VDD and the second power supply VSS, the disclosure is not limited thereto. For example, some of the light emitting elements LD may be electrically connected to each other in a forward direction between the first and second power supplies VDD and VSS, and other light emitting elements LD may be electrically connected to each other in a reverse direction. In an example, at least one sub-pixel SPX may include only a single light emitting element LD.

In an embodiment, first ends of respective light emitting elements LD may be electrically connected in common to the corresponding pixel circuit PXC through the first electrode and may be electrically connected to the first power supply VDD through the pixel circuit PXC. Second ends of respective light emitting elements LD may be electrically connected in common to the second power supply VSS through the second electrode.

The emission unit LSU may emit light with luminance corresponding to a driving current supplied thereto through the corresponding pixel circuit PXC. Therefore, an image may be displayed in the display area DA.

The pixel circuit PXC may be electrically connected to a scan line Si and a data line Dj of the corresponding sub-pixel SPX. For example, in case that the sub-pixel SPX is disposed in an i-th row and a j-th column of the display area DA, the pixel circuit PXC of the sub-pixel SPX may be electrically connected to the i-th scan line Si and the j-th data line Dj of the display area DA. The pixel circuit PXC may include first and second transistors T1 and T2 and a storage capacitor Cst.

The first transistor T1 (or a driving transistor) may be electrically connected between the first power supply VDD and the first electrode of the emission unit LSU. A gate electrode of the first transistor T1 may be electrically connected to a first node N1. The first transistor T1 may control the driving current that is supplied to the emission unit LSU in response to the voltage of the first node N1.

The second transistor T2 (or a switching transistor) may be electrically connected between the data line Dj and the first node N1. A gate electrode of the second transistor T2 may be electrically connected to the scan line Si.

In case that a scan signal having a gate-on voltage (e.g., a low voltage) is supplied thereto from the scan line Si, the second transistor T2 may be turned on to electrically connect the data line Dj and the first node N1 to each other. During each frame period, a data signal of a corresponding frame may be supplied to the data line Dj and may be transmitted to the first node N1 via the second transistor T2. Therefore, a voltage corresponding to the data signal may be charged in the storage capacitor Cst.

A first electrode of the storage capacitor Cst may be electrically connected to the first power supply VDD, and a second electrode thereof may be electrically connected to the first node N1. The storage capacitor Cst may store a voltage corresponding to the data signal supplied to the first node N1 during each frame period and may maintain the stored voltage until a data signal of a subsequent frame is supplied thereto.

Although FIG. 13A illustrates that all of the transistors, e.g., the first and second transistors T1 and T2, included in the pixel circuit PXC are P-type transistors, the disclosure is not limited thereto. In other words, at least one of the first and second transistors T1 and T2 may be changed to an N-type transistor.

For example, as shown in FIG. 13B, both the first and second transistors T1 and T2 may be N-type transistors. The sub-pixel SPX illustrated in FIG. 13B may have a configuration and an operation substantially similar to those of the pixel circuit PXC of FIG. 13A, except that the connection positions of some circuit elements are changed depending on a change in a transistor type. Therefore, descriptions of the sub-pixel SPX of FIG. 13B will be omitted.

The structure of the pixel circuit PXC is not limited to those in the embodiments illustrated in FIGS. 13A and 13B. For example, the pixel circuit PXC may be formed as pixel circuits having various structures and/or driving schemes. In an example, the pixel circuit PXC may be formed as in the embodiment illustrated in FIG. 13C.

Referring to FIG. 13C, the pixel circuit PXC may be further electrically connected to at least one additional scan line (or at least one additional control line) in addition to a scan line Si for a corresponding horizontal line. For example, a pixel circuit PXC of a sub-pixel SPX arranged in an i-th row of a display area DA may be further electrically connected to an (i−1)-th scan line Si−1 and/or an (i+1)-th scan line Si+1. Further, in an embodiment, the pixel circuit PXC may be further electrically connected to other power supplies in addition to the first and second power supplies VDD and VSS. For example, the pixel circuit PXC may also be electrically connected to an initialization power supply Vint. In an embodiment, the pixel circuit PXC may include first to seventh transistors T1 to T7 and a storage capacitor Cst.

The first transistor T1 may be electrically connected between the first power supply VDD and a first electrode of the emission unit LSU. A gate electrode of the first transistor T1 may be electrically connected to a first node N1. The first transistor T1 may control a driving current that is supplied to the emission unit LSU in response to the voltage of the first node N1.

The second transistor T2 may be electrically connected between a data line Dj and a first electrode of the first transistor T1. A gate electrode of the second transistor T2 may be electrically connected to a corresponding scan line Si. In case that a scan signal having a gate-on voltage is supplied to the second transistors T2 from the scan line Si, the second transistor T2 may be turned on to electrically connect the data line Dj to the first electrode of the first transistor T1. Therefore, in case that the second transistor T2 is turned on, a data signal supplied from the data line Dj may be transmitted to the first transistor T1.

The third transistor T3 may be electrically connected between a second electrode of the first transistor T1 and the first node N1. A gate electrode of the third transistor T3 may be electrically connected to the corresponding scan line Si. In case that a scan signal having a gate-on voltage is supplied to the third transistor T3 from the scan line Si, the third transistor T3 may be turned on to electrically connect the first transistor T1 in the form of a diode.

The fourth transistor T4 may be electrically connected between the first node N1 and the initialization power supply Vint. A gate electrode of the fourth transistor T4 may be electrically connected to a previous scan line, for example, the (i−1)-th scan line Si−1. In case that a scan signal having a gate-on voltage is supplied to the (i−1)-th scan line Si−1, the fourth transistor T4 may be turned on to transmit the voltage of the initialization power supply Vint to the first node N1. Here, the voltage of the initialization power supply Vint may be less than or equal to the lowest voltage of the data signal.

The fifth transistor T5 may be electrically connected between the first power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage (e.g., a high voltage) is supplied to the emission control line Ei, and may be turned on in other cases.

The sixth transistor T6 may be electrically connected between the first transistor T1 and the first electrode of the emission unit LSU. A gate electrode of the sixth transistor T6 may be electrically connected to the corresponding emission control line, e.g., the i-th emission control line Ei. The sixth transistor T6 may be turned off in case that an emission control signal having a gate-off voltage is supplied to the emission control line Ei and may be turned on in other cases.

The seventh transistor T7 may be electrically connected between the first electrode of the emission unit LSU, and the initialization power supply Vint. A gate electrode of the seventh transistor T7 may be electrically connected to one of scan lines in a subsequent stage, e.g., an (i+1)-th scan line Si+1. In case that a scan signal having a gate-on voltage is supplied to the (i+1)-th scan line Si+1, the seventh transistor T7 may be turned on to supply the voltage of the initialization power supply Vint to the first electrode of the emission unit LSU.

The storage capacitor Cst may be electrically connected between the first power supply VDD and the first node N1. The storage capacitor Cst may store a voltage corresponding to the data signal supplied to the first node N1 and the threshold voltage of the first transistor T1 during each frame period.

Although FIG. 13C illustrates the transistors, e.g., the first to seventh transistors T1 to T7, included in the pixel circuit PXC are P-type transistors, the disclosure is not limited thereto. For example, at least one of the first to seventh transistors T1 to T7 may be changed to an N-type transistor. The voltage level of a control signal (e.g., a scan signal and/or a data signal) for controlling at least one of the first to seventh transistors T1 to T7 may be changed.

Further, the structure of the sub-pixel SPX usable in the disclosure is not limited to those in the embodiments illustrated in FIGS. 13A to 13C, and the sub-pixel SPX may have various structures. For example, the pixel circuit PXC included in the sub-pixel SPX may be formed as pixel circuits having various structures and/or driving schemes. Furthermore, in other embodiments, the sub-pixel SPX may be provided in a passive light emitting display device or the like. The pixel circuit PXC may be omitted, and each of first and second electrodes of the emission unit LSU may be directly and electrically connected to a scan line Si, a data line Dj, power lines PL1 and PL2, and/or a control line.

Figure 14A:
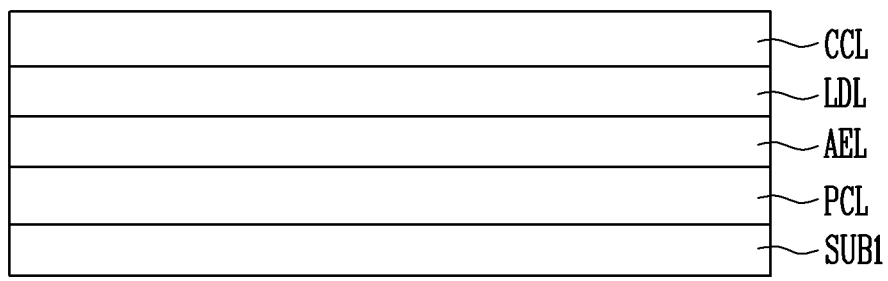
FIGS. 14A and 14B are cross-sectional views schematically illustrating an example of the display device of FIG. 12.
Figure 14B:
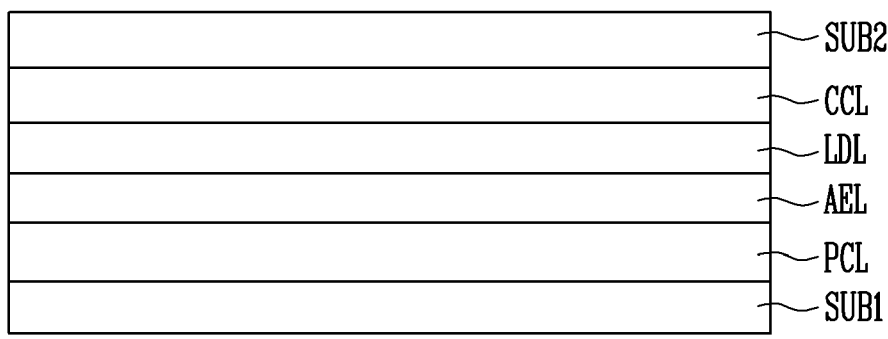

FIGS. 14A and 14B are schematic sectional views illustrating an example of the display device of FIG. 12.

First, referring to FIGS. 12 and 14A, the display device (or a display panel PNL) may include a first substrate SUB1, a pixel circuit layer PCL, a common electrode layer AEL, a light emitting element layer LDL (or a display element layer), and a color conversion layer CCL. Since the first substrate SUB1, the common electrode layer AEL, the light emitting element layer LDL, and the color conversion layer CCL are substantially the same as the substrate SUB, the common electrode layer AEL, the light emitting element layer LDL, and the color conversion layer CCL, described above with reference to FIGS. 4 to 6, repeated descriptions thereof will be omitted.

The pixel circuit layer PCL may be disposed between the first substrate SUB1 and the light emitting element layer LDL or between the first substrate SUB1 and the common electrode layer AEL The pixel circuit layer PCL may include a pixel circuit PXC described above with reference to FIGS. 13A to 13C.

In embodiments, the display device may further include a second substrate SUB2 disposed on the overall surface of the color conversion layer CCL. The second substrate SUB2 may be substantially identical or similar to the substrate SUB described above with reference to FIGS. 4 to 6.

As illustrated in FIG. 14B, in case that the display device (or the display panel PNL) includes the second substrate SUB2, the color conversion layer CCL may be manufactured separately from the light emitting element layer LDL and may be coupled or bonded to the light emitting element layer LDL. For example, the color conversion layer CCL may be formed on a first surface of the second substrate SUB2, an upper structure (or an upper panel) including the color conversion layer CCL and the second substrate SUB2 may be coupled to a lower structure (or a lower panel) including the first substrate SUB1, the pixel circuit layer PCL, the common electrode layer AEL, and the light emitting element layer LDL. As described above with reference to FIGS. 10G and 10H, separate common electrodes may be disposed on a second surface of the second substrate SUB2, color conversion elements may be provided, and a voltage may be applied to the common electrodes. Therefore, the color conversion elements may be aligned in a specific direction (e.g., the second alignment direction), and the common electrodes may be removed from the second substrate SUB2 after the color conversion elements are aligned. The upper structure and the lower structure may be aligned with each other such that the second alignment direction of the color conversion elements in the color conversion layer CCL is identical or parallel to the first alignment direction of the light emitting elements LD in the light emitting element layer LDL, and the upper structure may be coupled to the lower structure. For example, the color conversion layer CCL may be separately manufactured and coupled to the light emitting element layer LDL without being directly formed on the light emitting element layer LDL, and the second alignment direction of the color conversion elements in the color conversion layer CCL may be substantially identical or parallel to the first alignment direction of the light emitting elements LD in the light emitting element layer LDL.

Although FIG. 14B illustrates that the display device (or the display panel PNL) includes the alignment electrode layer AEL, the alignment electrode layer AEL may be omitted in some embodiments.

Figure 15:
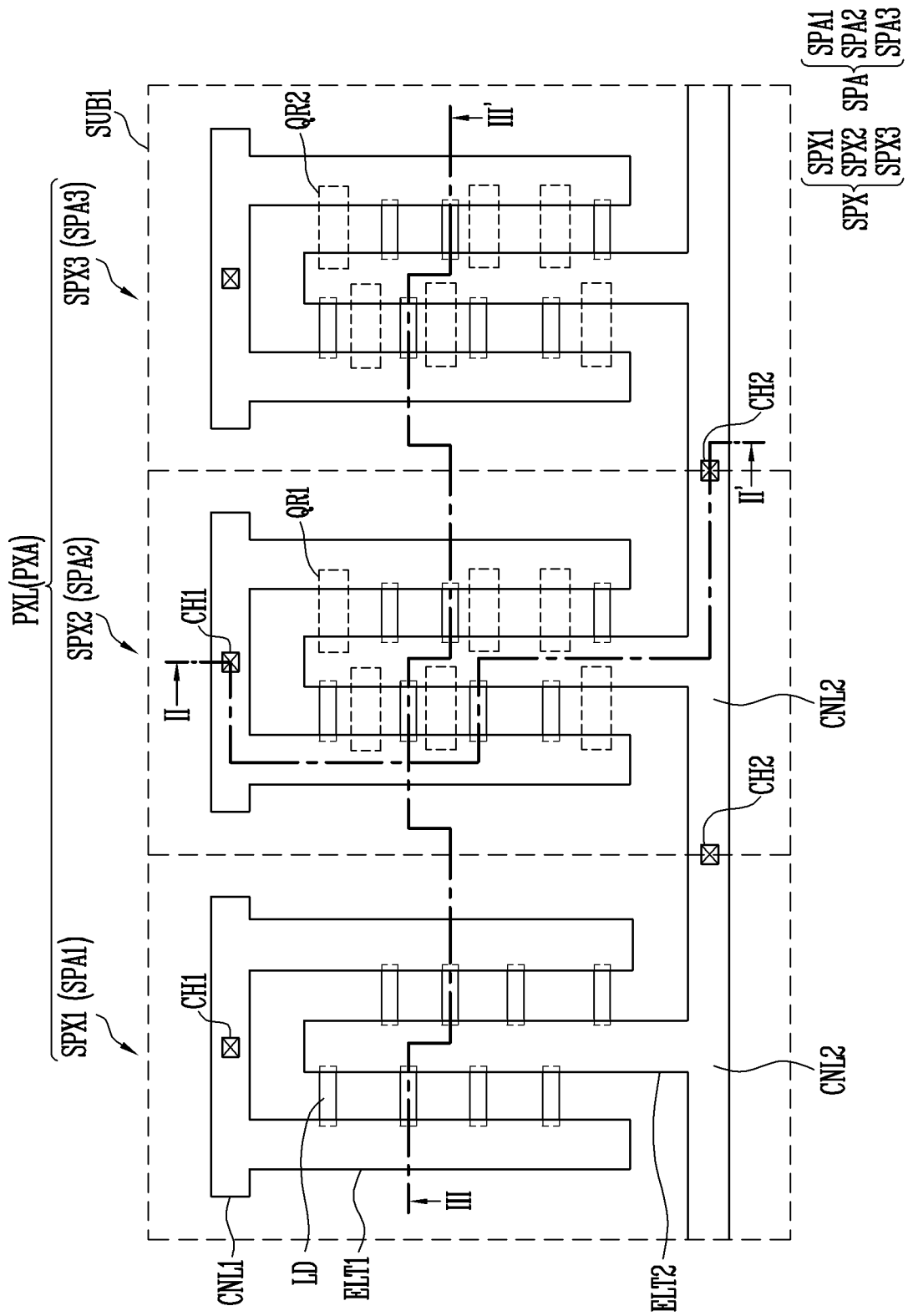
FIG. 15 is a plan view schematically illustrating example pixels included in the display device of FIG. 12.

FIG. 15 is a schematic plan view illustrating an example of a pixel included in the display device of FIG. 12. FIG. 15 illustrates the structure of a pixel PXL, focusing on a light emitting element layer LDL and a color conversion layer CCL of the pixel PXL.

Referring to FIGS. 12 and 15, the pixel PXL may be formed in a pixel area PXA defined on a first substrate SUB. The pixel area PXA may include sub-pixel areas SPA corresponding to sub-pixels SPX forming the pixel PXL.

For example, the pixel area PXA may include a first sub-pixel area SPA1 in which a first sub-pixel SPX1 is formed, a second sub-pixel area SPA2 in which a second sub-pixel SPX2 is formed, and a third sub-pixel area SPA3 in which a third sub-pixel SPX3 is formed. Although not illustrated in FIG. 15, each of the first to third sub-pixel areas SPA1, SPA2, and SPA3 may include an emission area in which at least one pair of a first electrode ELT1 and a second electrode ELT2 and at least one light emitting element LD electrically connected between the first and second electrodes ELT1 and ELT2 are arranged. Here, the emission area may be defined by a pixel-defining layer enclosing the emission area, bank patterns, banks (see FIG. 18), or the like.

Since the first to third sub-pixels SPX1, SPX2, and SPX3 are substantially identical or similar to the first to third sub-pixels SPX1, SPX2, and SPX3 described above with reference to FIGS. 4 to 6, repeated descriptions thereof will be omitted.

In an embodiment, the first, second and third sub-pixels SPX1, SPX2, and SPX3 may have a substantially identical or similar structure, except for the color conversion elements QR1 and QR2. Hereinafter, for convenience of description, after one of the first, second, and third sub-pixels SPX1, SPX2, and SPX3 may be referred to as a sub-pixel SPX, an area in which the sub-pixel SPX is formed may be referred to as a sub-pixel area SPA, and the structure of the sub-pixel SPX will be described in detail.

In an embodiment, the first electrode ELT1 may be electrically connected to a pixel circuit PXC of the sub-pixel SPX, e.g., the pixel circuit PXC illustrated in one of FIGS. 13A to 13C, through a first contact hole CH1. In an embodiment, the first contact hole CH1 may be disposed outside the emission area of each sub-pixel SPX.

In an embodiment, the pixel circuit PXC may be disposed under the light emitting elements LD arranged in a corresponding sub-pixel area SPA. For example, each pixel circuit PXC may be formed on a pixel circuit layer (or a circuit element layer including circuit elements such as transistors) under the light emitting elements LD and may be electrically connected to the first electrode ELT1 through the first contact hole CH1.

In an embodiment, the second electrode ELT2 may be electrically connected to a second power supply VSS (see FIG. 13A). For example, the second electrode ELT2 may be electrically connected to the second power supply VSS through a second contact hole CH2 and a power line (not illustrated) electrically connected thereto. Similar to the first contact hole CH1, the second contact hole CH2 may be disposed outside the emission area of each sub-pixel SPX, but the disclosure is not limited thereto.

In an embodiment, an area of a power line for supplying the second power supply VSS may be disposed on a pixel circuit layer under the light emitting elements LD. For example, the power line may be disposed on the pixel circuit layer PCL (see FIG. 14A) under the light emitting elements LD and may be electrically connected to the second electrode ELT2 through the second contact hole CH2. However, the disclosure is not limited thereto, and the position of the power line may be changed in various manners.

In embodiments, all of the light emitting elements LD (or LD(B)) may be blue light emitting diodes which emit light of a blue color. To form a full-color pixel PXL, a first color conversion element QR1 (e.g., a green quantum rod for converting blue light into green light) may be disposed on the top of the second sub-pixel SPX2, and a second color conversion element QR2 (e.g., a red quantum rod for converting blue light into red light) may be disposed on the top of the third sub-pixel SPX3.

As described above, each of the first and second color conversion elements QR1 and QR2 may have a rod-like shape and may be disposed between first and second electrodes ELT1 and ELT2 of the corresponding sub-pixel area SPX. In an example, most of first and second color conversion elements QR1 and QR2 may be disposed between the first and second electrodes ELT1 and ELT2 of the corresponding sub-pixel area SPX. Further, the second alignment direction ADR2 of the first and second color conversion elements QR1 and QR2 may be identical to or substantially the same as the first alignment direction ADR1 of the light emitting elements LD arranged in the corresponding sub-pixel area SPX.

Figure 16A:
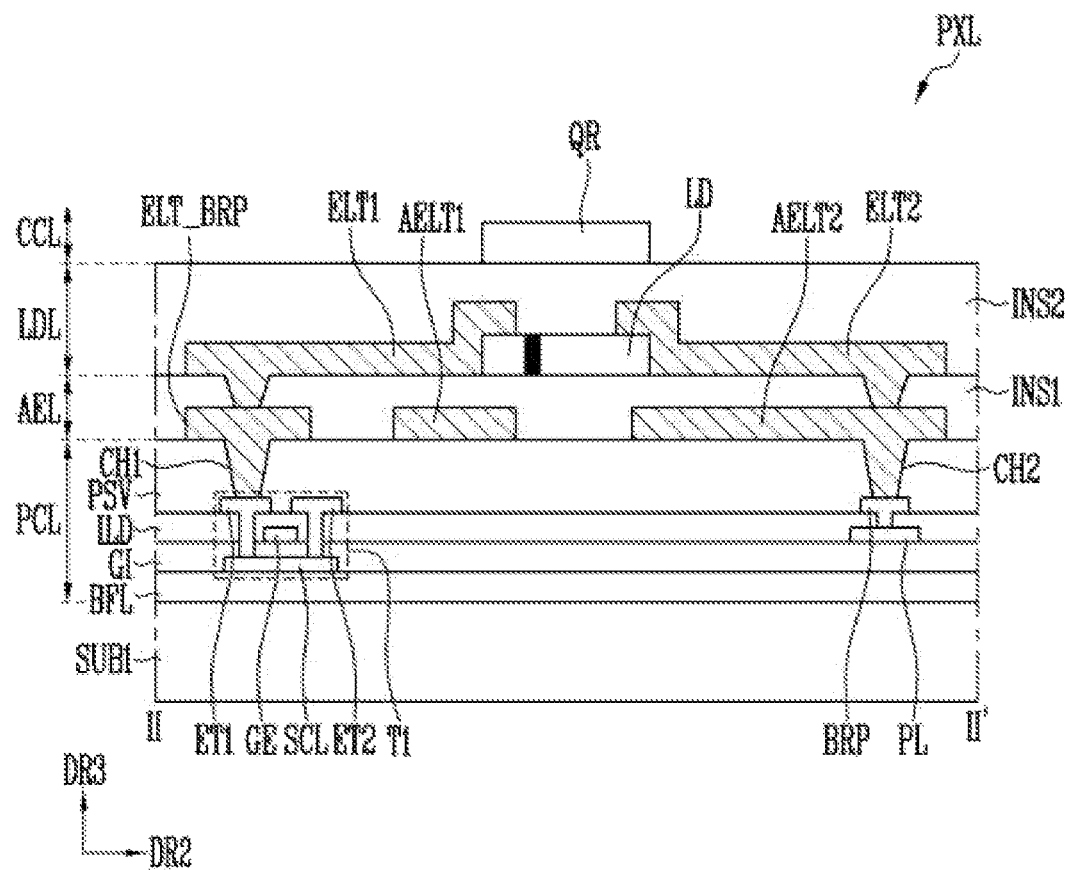
FIG. 16A is a cross-sectional view schematically illustrating an example pixel taken along line II-II' of FIG. 15.

FIG. 16A is a schematic sectional view illustrating an example of the pixel taken along line of FIG. 15. FIG. 16A illustrates an example of the pixel included in the display device of FIG. 14A.

Referring to FIGS. 14A, 15, and 16A, a pixel circuit layer PCL, a common electrode layer AEL, a light emitting element layer LDL, and a color conversion layer CCL may be sequentially arranged in a pixel area SPA of a first substrate SUB1. The common electrode layer AEL, the pixel circuit layer PCL, and the light emitting element layer LDL may be formed on the entire display area DA of the display panel PNL.

The pixel circuit layer PCL may include circuit elements forming the pixel circuit PXC of the pixel PXL.

For example, the pixel circuit layer PCL may include transistors, e.g., first transistors T1 of FIGS. 13A and 13B, arranged in the pixel area PXA. Although not illustrated in FIG. 16A, the pixel circuit layer PCL may include a storage capacitor Cst arranged in the pixel area PXA, various types of signal lines (e.g., a scan line Si and a data line Dj of FIGS. 13A and 13B) electrically connected to the pixel circuit PXC, and various types of power lines (e.g., a first power line and a second power line for respectively transmitting the first power supply VDD and the second power supply VSS) electrically connected to the pixel circuit PXC and/or the light emitting elements LD.

In an embodiment, the pixel circuit layer may have a sectional structure substantially identical or similar to that of the transistors provided in the pixel circuit PXC, for example, the first transistor T1. However, the disclosure is not limited thereto, and in other embodiments, at least some of the transistors may have different types and/or structures.

Further, the pixel circuit layer PCL may include insulating layers. For example, the pixel circuit layer PCL may include a buffer layer BFL, a gate insulating layer GI, an interlayer insulating layer ILD, and a passivation layer PSV which are sequentially stacked each other on a surface of the first substrate SUB1.

In an embodiment, the buffer layer BFL may prevent impurities from being diffused to circuit elements. The buffer layer BFL may be formed in a single layer structure and may also be formed in a multilayer structure including at least two or more layers. In case that the buffer layer BFL is formed in a multilayer structure, the respective layers may be formed of a same material or different materials. In embodiments, the buffer layer BFL may be omitted.

In an embodiment, the first transistor T1 may include a semiconductor layer SCL, a gate electrode GE, a first transistor electrode ET1, and a second transistor electrode ET2. In an embodiment, although FIG. 16A illustrates that the first transistor T1 has the first transistor electrode ET1 and the second transistor electrode ET2 formed separately from the semiconductor layer SCL, the disclosure is not limited thereto. For example, in an embodiment, first and/or second transistor electrodes ET1 and ET2 provided in at least one transistor arranged in the pixel area PXA may be integral with respective semiconductor layers SCL.

The semiconductor layer SCL may be disposed on the buffer layer BFL. For example, the semiconductor layer SCL may be disposed between the first substrate SUB1, on which the buffer layer BFL is formed, and the gate insulating layer GI. The semiconductor layer SCL may include a first region contacting the first transistor electrode ET1, a second region contacting the second transistor electrode ET2, and a channel region disposed between the first and second regions. In an embodiment, one of the first and second regions may be a source region, and the other thereof may be a drain region.

In an embodiment, the semiconductor layer SCL may be a semiconductor pattern formed of polysilicon, amorphous silicon, an oxide semiconductor, or the like. The channel region of the semiconductor layer SCL may be an intrinsic semiconductor as a semiconductor pattern undoped with impurities, and the first and second regions of the semiconductor layer SCL may be semiconductor patterns doped with impurities.

The gate electrode GE may be disposed on the semiconductor layer SCL with the gate insulating layer GI interposed therebetween. For example, the gate electrode GE may be disposed between the gate insulating layer GI and the interlayer insulating layer ILD so as to overlap at least a portion of the semiconductor layer SCL.

The first and second transistor electrodes ET1 and ET2 may be disposed on the semiconductor layer SCL and the gate electrode GE with at least one interlayer insulating layer IDL interposed therebetween. For example, the first and second transistor electrodes ET1 and ET2 may be interposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first region and the second region of the semiconductor layer SCL through contact holes passing through the gate insulating layer GI and the interlayer insulating layer ILD.

In an embodiment, one of the first and second transistor electrodes ET1 and ET2 of at least one transistor (e.g., the first transistor T1 illustrated in FIGS. 13A and 13B) provided in the pixel circuit PXC may be electrically connected to a bridge electrode ELT_BRP disposed on the top of the passivation layer PSV through the first contact hole CH1 passing through the passivation layer PSV.

In an embodiment, at least one signal line and/or at least one power line electrically connected to the pixel PXL and first electrodes of the circuit elements forming the pixel circuit PXC may be disposed on a same layer. For example, a power line PL (e.g., a second power line for the second power supply VSS) and the gate electrode GE of the first transistor T1 may be disposed on a same layer and may be electrically connected to the second common electrode AELT2 disposed on the top of the passivation layer PSV, through a bridge pattern BRP that is disposed on the same layer as the first and second transistor electrodes ET1 and ET2 and through at least one second contact hole CH2 that passes through the passivation layer PSV. However, the structure and/or position of the power line PL may be changed in various manners.

The common electrode layer AEL may include the first common electrode AELT1 and the second common electrode AELT2. Since the first and second common electrodes AELT1 and AELT2 are substantially identical to the first and second common electrodes AELT1 and AELT2 described above with reference to FIGS. 4 to 6, repeated descriptions thereof will be omitted.

The common electrode layer AEL may further include the bridge electrode ELT_BRP. The bridge electrode ELT_BRP may electrically connect the first electrode ELT1 of the light emitting element layer LDL to the first transistor T1 (or the first transistor electrode ET1) of the pixel circuit layer PCL.

Since the light emitting element layer LDL is substantially the same as the light emitting element layer LDL described above with reference to FIG. 6, repeated descriptions thereof will be omitted.

The second electrode ELT2 of the light emitting element layer LDL may be electrically connected to the second common electrode AELT2 via a through hole passing through the first insulating layer INS1. The first electrode ELT1 of the light emitting element layer LDL may be electrically connected to the first transistor T1 (or the first transistor electrode ET1) of the pixel circuit layer PCL via the through hole passing through the insulating layers INS1 and the bridge electrode ELT_BRP.

Since the color conversion layer CCL is substantially the same as the color conversion layer CCL described above with reference to FIG. 6, repeated descriptions thereof will be omitted.

Although FIG. 16A illustrates the second common electrode AELT2 is electrically connected to the second electrode ELT2 of the light emitting element layer LDL, the disclosure is not limited thereto. For example, the second electrode ELT2 of the light emitting element layer LDL may be electrically connected to the power line PL through a separate bridge electrode without being electrically connected to the second common electrode AELT2.

Figure 16B:
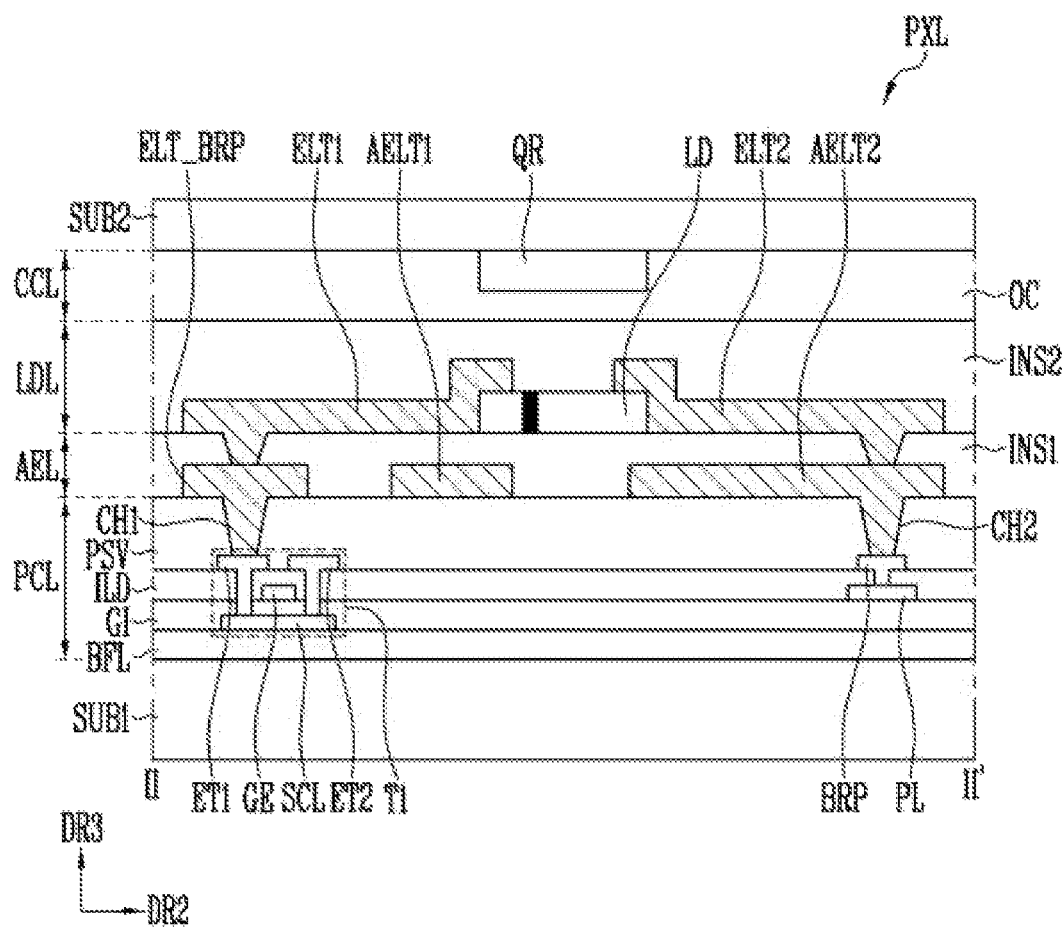
FIG. 16B is a cross-sectional view schematically illustrating another example pixel taken along line II-II' of FIG. 15.

FIG. 16B is a schematic sectional view illustrating an example of the pixel taken along line II-II' of FIG. 15. FIG. 16A illustrates an example of the pixel included in the display device of FIG. 14B.

Referring to FIGS. 14B, 15, and 16A and 16B, the pixel of FIG. 16B may be substantially identical or similar to that of FIG. 16A in that the former includes a color conversion layer CCL and a second substrate SUB2. Therefore, repeated descriptions thereof will be omitted.

The color conversion layer CCL may include a color conversion element QR and an overcoat layer OC (or an insulating layer).

As described above with reference to FIG. 14B, the color conversion element QR may be formed on a first surface (e.g., a bottom surface in FIG. 14B) of the second substrate SUB2. The overcoat layer OC may be disposed on the entirety of the first surface of the second substrate SUB2 and may cover the color conversion element QR. The overcoat layer OC may be substantially identical or similar to the first and second insulating layers INS1 and INS2 described above with reference to FIGS. 4 to 6.

An upper structure (or an upper panel) including the color conversion layer CCL and the second substrate SUB2 may be coupled to a lower structure (or a lower panel) including the first substrate SUB1, the pixel circuit layer PCL, the common electrode layer AEL, and the light emitting element layer LDL). Therefore, the overcoat layer OC may be disposed on the second insulating layer INS2, the second substrate SUB2 may be disposed on the overcoat layer OC, and the color conversion element QR may be disposed between the overcoat layer OC (or the second insulating layer INS2) and the second substrate SUB2.

A second alignment direction of the color conversion element QR in the color conversion layer CCL may be substantially identical or parallel to a first alignment direction of the light emitting elements LD in the light emitting element layer LDL.

Although FIG. 16B illustrates that the color conversion element QR overlaps the light emitting element LD in a third direction DR3, this is merely illustrative, and the disclosure is not limited thereto. In FIG. 16B, since the color conversion element QR is formed independently of the second substrate SUB2, the color conversion element QR may not overlap the light emitting element LD, and the color conversion element QR may not be disposed between the first and second electrodes ELT1 and ELT2 (or the first and second common electrodes AELT1 and AELT2) in a plan view.

FIGS. 17A to 17D are schematic sectional views illustrating an example of the pixel taken along line II-II' of FIG. 15.

Referring to FIGS. 14B, 16B, and 17A to 17D, the pixels in FIGS. 17A to 17D may be substantially identical or similar to the pixel of FIG. 16B except for the light emitting element layer LDL, and thus repeated descriptions thereof will be omitted.

Figure 17A:
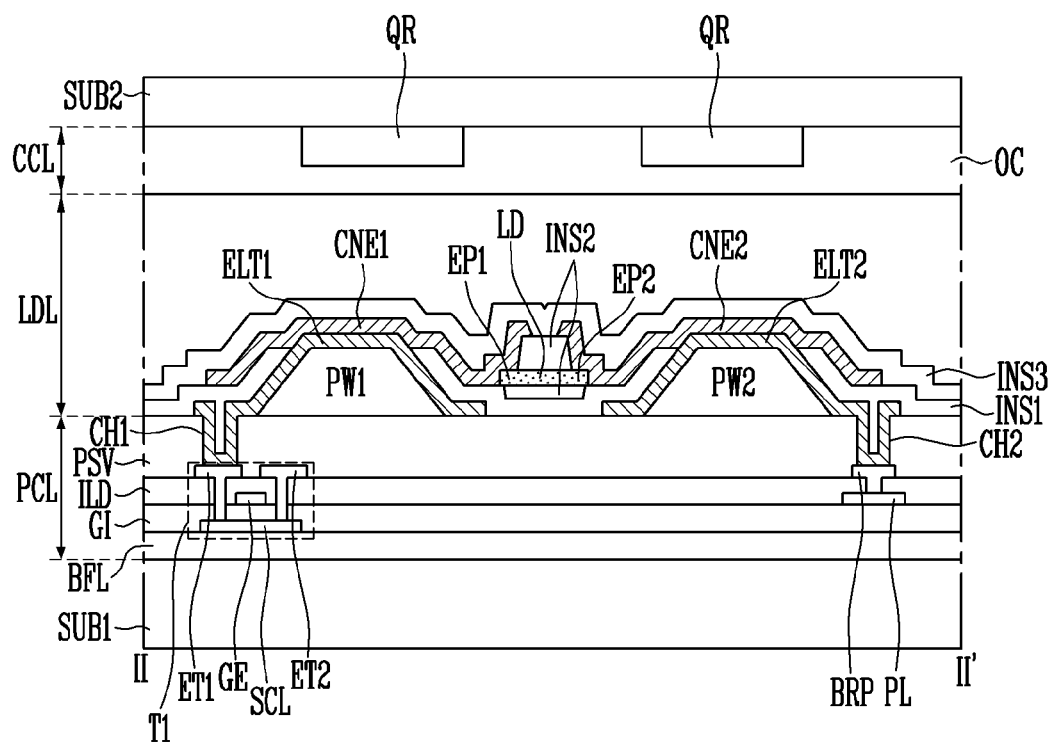
FIGS. 17A to 17D are cross-sectional views schematically illustrating a further example pixel taken along line II-II' of FIG. 15.

As illustrated in FIG. 17A, the light emitting element layer LDL may include first and second bank patterns PW1 and PW2, first and second electrodes ELT1 and ELT2, a first insulating layer INS1, light emitting elements LD, a second insulating layer INS2, first and second contact electrodes CNE1 and CNE2, and a third insulating layer INS3, which are sequentially disposed and/or formed on a pixel circuit layer PCL.

The first and second bank patterns PW1 and PW2 may be disposed on the pixel circuit layer PCL. The first and second bank patterns PW1 and PW2 may be arranged in an emission area to be spaced apart from each other. The first and second bank patterns PW1 and PW2 may protrude from the pixel circuit layer PCL in a height direction. In an embodiment, the first and second bank patterns PW1 and PW2 may have, but are not limited to, substantially a same height.

In an embodiment, the first bank pattern PW1 may be disposed between the pixel circuit layer PCL and the first electrode ELT1. The first bank pattern PW1 may be arranged adjacent to first ends EP1 of the light emitting elements LD. For example, a side surface of the first bank pattern PW1 may be positioned adjacent to the first ends EP1 of the light emitting elements LD and may face the first ends EP1.

In an embodiment, the second bank pattern PW2 may be disposed between the pixel circuit layer PCL and the second electrode ELT2. The second bank pattern PW2 may be arranged adjacent to second ends EP2 of the light emitting elements LD. For example, a side surface of the second bank pattern PW2 may be positioned adjacent to the second ends EP2 of the light emitting elements LD and may face the second ends EP2.

Figure 17B:
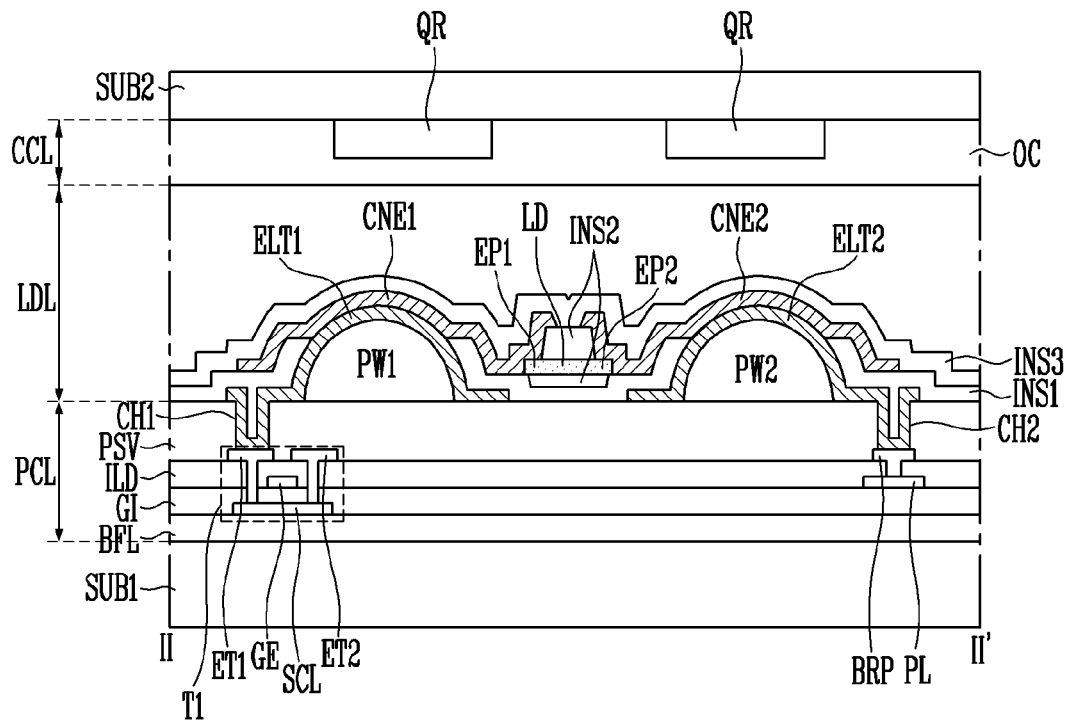

In an embodiment, the first and second bank patterns PW1 and PW2 may have various shapes. In an example, each of the first and second bank patterns PW1 and PW2 may have a cross-sectional shape of a trapezoid, the width of which decreases toward the top thereof, as illustrated in FIG. 17A. Each of the first and second bank patterns PW1 and PW2 may have a sloped surface as at least one side surface thereof. In an example, as illustrated in FIG. 17B, each of the first and second bank patterns PW1 and PW2 may have a cross-sectional shape of a semicircle or a semiellipse, the width of which decreases toward the top thereof. Each of the first and second bank patterns PW1 and PW2 may have a curved surface as at least one side surface thereof.

For example, the shapes of the first and second bank patterns PW1 and PW2 are not limited to particular shapes and may be changed in various manners. In an embodiment, at least one of the first and second bank patterns PW1 and PW2 may be omitted, or the position thereof may be changed.

The first and second bank patterns PW1 and PW2 may include an insulating material including an inorganic and/or organic material. For example, the first and second bank patterns PW1 and PW2 may include at least one inorganic layer which contains various inorganic insulating materials, as well as $SiN_x$ or $SiO_x$. Alternatively, the first and second bank patterns PW1 and PW2 may include at least one organic layer including various organic insulating materials and/or a photoresist layer, or may be formed as a single or multilayer insulator including a combination of organic and inorganic materials. For example, materials forming the first and second bank patterns PW1 and PW2 may be changed in various manners.

In an embodiment, the first and second bank patterns PW1 and PW2 may function as reflective members. For example, the first and second bank patterns PW1 and PW2, along with the first and second electrodes ELT1 and ELT2 provided on the top thereof, may function as reflective members for improving optical efficiency of the pixel PXL by inducing or guiding light emitted from respective light emitting elements LD in a desired direction.

The first and second electrodes ELT1 and ELT2 may be respectively disposed on the tops of the first and second bank patterns PW1 and PW2. The first and second electrodes ELT1 and ELT2 may be spaced apart from each other.

In an embodiment, the first and second electrodes ELT1 and ELT2 respectively disposed on the tops of the first and second bank patterns PW1 and PW2 may have shapes corresponding to those of the first and second bank patterns PW1 and PW2, respectively. For example, while the first and second electrodes ELT1 and ELT2 have sloped or curved surfaces corresponding to the first and second bank patterns PW1 and PW2, they may protrude in the height direction (or the thickness direction) of the pixel circuit layer PCL.

Each of the first and second electrodes ELT1 and ELT2 may include at least one conductive material. In an example, each of the first and second electrodes ELT1 and ELT2 may include, but is not limited to, a material corresponding to at least one of a metal such as Ag, Mg, Al, Pt, Pd, Au, Ni, Nd, Ir, Cr, Ti, and an alloy thereof, a conductive oxide such as ITO, IZO, ZnO, or ITZO, and a conductive polymer such as PEDOT.

Further, each of the first and second electrodes ELT1 and ELT2 may be formed in a single layer structure or a multi-layer structure. In an example, each of the first and second electrodes ELT1 and ELT2 may include at least one reflective electrode layer. Each of the first and second electrodes ELT1 and ELT2 may selectively further include at least one of at least one transparent electrode layer disposed on and/or under the reflective electrode layer and at least one conductive capping layer covering or overlapping the top of the reflective electrode layer and/or the transparent electrode layer.

In an embodiment, the reflective electrode layer of each of the first and second electrodes ELT1 and ELT2 may be made of a conductive material having uniform reflectivity. In an example, the reflective electrode layer may include, but is not limited to, at least one of metals such as Ag, Mg, Al, Pt, Pd, Au, Ni, Nd, Ir, Cr, and an alloy thereof. For example, the reflective electrode layer may be made of various types of reflective conductive materials. In case that each of the first and second electrodes ELT1 and ELT2 includes a reflective electrode layer, light emitted from the opposite ends of each of the light emitting elements LD, for example, the first and second ends EP1 and EP2, may further travel in a direction (e.g., in a front direction) in which an image is displayed. In particular, in case that the first and second electrodes ELT1 and ELT2 face the first and second ends EP1 and EP2 of the light emitting elements LD while having a sloped or curved surface corresponding to the shapes of the first and second bank patterns PW1 and PW2, light emitted from the first and second ends EP1 and EP2 of each of the light emitting elements LD may be reflected from the first and second electrodes ELT1 and ELT2 to further travel in the frontal direction of the display panel PNL (e.g., from the upward direction of the first substrate SUB1). Accordingly, the efficiency of light emitted from the light emitting elements LD may be improved.

Further, the transparent electrode layer of each of the first and second electrodes ELT1 and ELT2 may be made of various types of transparent electrode materials. For example, the transparent electrode layer may include, but is not limited to, ITO, IZO or ITZO. In an embodiment, each of the first and second electrodes ELT1 and ELT2 may be formed in a triple-layer structure having a stacked structure of ITO/Ag/ITO. Likewise, in case that each of the first and second electrodes ELT1 and ELT2 is formed in a multilayer structure of at least two or more layers, a voltage drop attributable to a signal delay (RC delay) may be minimized. Accordingly, a desired voltage may be effectively transferred to the light emitting elements LD.

In case that each of the first and second electrodes ELT1 and ELT2 includes the conductive capping layer for covering a reflective electrode layer and/or a transparent electrode layer, the reflective electrode layers of the first and second electrodes ELT1 and ELT2 may be prevented from being damaged by defects occurring in a process for manufacturing pixels PXL. However, the conductive capping layer may be selectively included in the first and second electrodes ELT1 and ELT2 and may be omitted in some embodiments. Further, the conductive capping layer may be regarded as the component of each of the first and second electrodes ELT1 and ELT2, or as a separate component disposed on the first and second electrodes ELT1 and ELT2.

The first insulating layer INS1 may be disposed in portions of the first and second electrodes ELT1 and ELT2. For example, the first insulating layer INS1 may cover or overlap the portions of the first and second electrodes ELT1 and ELT2 and may include an opening that exposes other portions of the first and second electrodes ELT1 and ELT2.

In an embodiment, the first insulating layer INS1 may primarily cover the overall surfaces of the first and second electrodes ELT1 and ELT2. After the light emitting elements LD have been provided and aligned on the first insulating layer INS1, the first insulating layer INS1 may be partially opened to expose the first and second electrodes ELT1 and ELT2. Alternatively, after the provision and alignment of the light emitting elements LD have been completed, the first insulating layer INS1 may be patterned in the form of an individual pattern that are locally disposed under the light emitting elements LD.

For example, the first insulating layer INS1 may be interposed between the first and second electrodes ELT1 and ELT2 and the light emitting elements LD and may expose at least a portion of each of the first and second electrodes ELT1 and ELT2. The first insulating layer INS1 may cover or overlap the first and second electrodes ELT1 and ELT2 after the first and second electrodes ELT1 and ELT2 have been formed, thereby preventing the first and second electrodes ELT1 and ELT2 from being damaged or metal from being extracted during a subsequent process. Further, the first insulating layer INS1 may stably hold each light emitting element LD.

The light emitting elements LD may be provided and aligned on the first insulating layer INS1. In an example, the light emitting elements LD may be provided by an inkjet method or the like, and the light emitting elements LD may be aligned between the first and second electrodes ELT1 and ELT2 by a predetermined voltage (e.g., an alignment signal) applied to the first and second electrodes ELT1 and ELT2.

The second insulating layer INS2 may be disposed on the top of the light emitting elements LD especially, the light emitting elements LD aligned between first and second electrodes ELT1 and ELT2, and may expose the first and second ends EP1 and EP2 of the light emitting elements LD. For example, the second insulting layer INS2 may be partially disposed only on the tops of portions of the light emitting elements LD without covering the first and second ends EP1 and EP2 of the light emitting elements LD. The second insulating layer INS2 may be formed as, but is not limited to, an independent pattern on each of the sub-pixel areas. Further, as illustrated in FIG. 17A, in case that a space is present between the first insulating layer INS1 and the light emitting elements LD before the second insulating layer INS2 is formed, the space may be filled with the second insulating layer INS2. Accordingly, the light emitting elements LD may be more stably held.

The first and second contact electrodes CNE1 and CNE2 may be disposed on the first and second electrodes ELT1 and ELT2 and the first and second ends EP1 and EP2 of the light emitting elements LD. In an embodiment, the first and second contact electrodes CNE1 and CNE2 may be disposed on a same layer, as illustrated in FIG. 17A. The first and second contact electrodes CNE1 and CNE2 may be formed by a same process using a same conductive material, but the disclosure is not limited thereto.

The first and second contact electrodes CNE1 and CNE2 may electrically couple the first and second ends EP1 and EP2 of the light emitting elements LD to the first and second electrodes ELT1 and ELT2, respectively.

For example, the first contact electrode CNE1 may be disposed on the first electrode ELT1 so as to electrically contact the first electrode ELT1. For example, the first contact electrode CNE1 may electrically contact the first electrode ELT1 in a portion of the first electrode ELT1 (e.g., a first contactor), which is not covered with the first insulating layer INS1. Further, the first contact electrode CNE1 may be disposed on the first ends EP1 of the light emitting elements LD so as to contact the first end EP1 of at least one light emitting element LD adjacent to the first electrode ELT1, e.g., the first ends EP1 of the light emitting elements LD. For example, the first contact electrode CNE1 may cover or overlap the first ends EP1 of the light emitting elements LD and at least one portion of the first electrode ELT1 corresponding thereto. Therefore, the first ends EP1 of the light emitting elements LD may be electrically connected to the first electrode ELT1.

Likewise, the second contact electrode CNE2 may be disposed on the second electrode ELT2 so as to electrically contact the second electrode ELT2. For example, the second contact electrode CNE2 may electrically contact the second electrode ELT2 in a portion of the second electrode ELT2 (e.g., a second contactor), which is not covered with the first insulating layer INS1. Further, the second contact electrode CNE2 may be disposed on the second ends EP2 to electrically contact the second end EP2 of at least one light emitting element LD adjacent to the second electrode ELT2, e.g., the second ends EP2 of the light emitting elements LD. For example, the second contact electrode CNE2 may cover or overlap the second ends EP2 of the light emitting elements LD and at least one portion of the second electrode ELT2 corresponding thereto. By means of this, the second ends EP2 of the light emitting elements LD may be electrically connected to the second electrode ELT2.

The third insulating layer INS3 may be formed and/or disposed on a first surface of the first substrate SUB1 on which the first and second bank patterns PW1 and PW2, the first and second electrodes ELT1 and ELT2, the light emitting elements LD, and the first and second contact electrodes CNE1 and CNE2 are formed such that the third insulating layer INS3 covers the first and second bank patterns PW1 and PW2, the first and second electrodes ELT1 and ELT2, the light emitting elements LD, and the first and second contact electrodes CNE1 and CNE2. The third insulating layer INS3 may include, but is not limited to, a thin film encapsulation layer including at least one inorganic layer and/or at least one organic layer. Further, in an embodiment, at least one overcoat layer, not illustrated, may be further disposed on the top of the third insulating layer INS3.

In an embodiment, each of the first to third insulating layers INS1, INS2, and INS3 may be formed in a single layer or multi-layer structure and may include at least one inorganic insulating material and/or at least one organic insulating material. For example, each of the first to third insulating layers INS1, INS2, and INS3 may include various organic/inorganic insulating materials including SiNx, and the material forming each of the first to third insulating layers INS1, INS2, and INS3 is not particularly limited. The first to third insulating layers INS1, INS2, and INS3 may include different types of insulating materials, or at least some of the first to third insulating layers INS1, INS2, and INS3 may include a same insulating material.

The color conversion layer CCL including the color conversion elements QR may be formed on a first surface (e.g., a bottom surface in FIG. 14B) of the second substrate SUB2, and an upper structure (or an upper panel) including the color conversion layer CCL and the second substrate SUB2 may be disposed on a lower structure (or a lower panel) including the first substrate SUB1, the pixel circuit layer PCL, the common electrode layer AEL, and the light emitting element layer LDL. In embodiments, the color conversion layer CCL may be spaced apart from the light emitting element layer LDL, but the disclosure is not limited thereto.

In embodiments, the first and second contact electrodes CNE1 and CNE2 may be disposed on different layers.

Figure 17C:
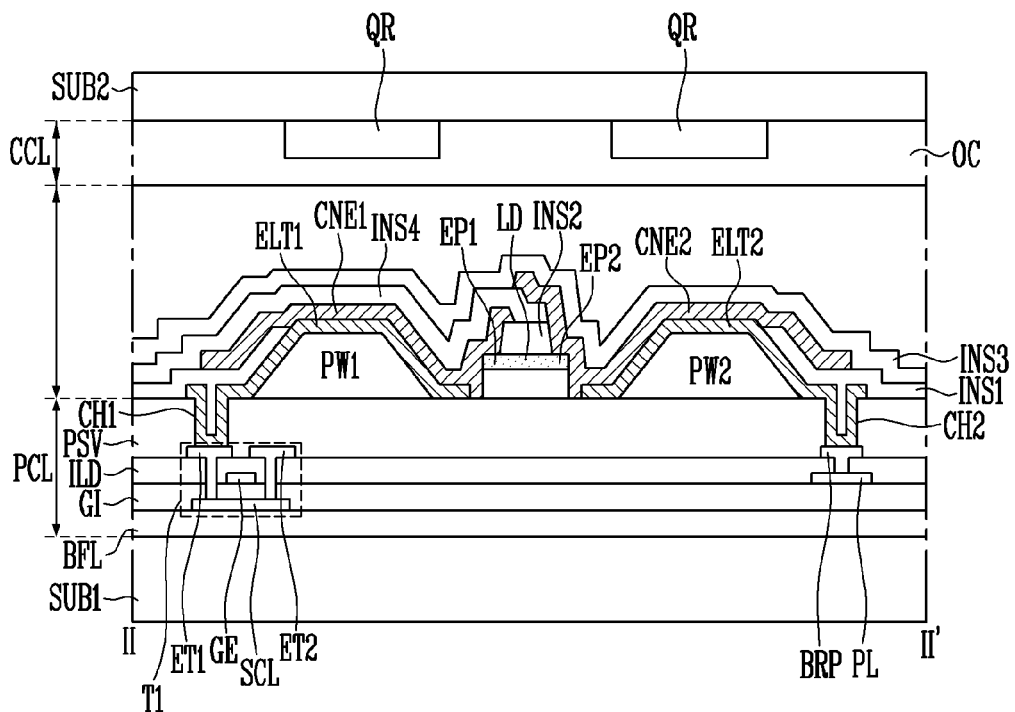

Referring to FIG. 17C, the first contact electrode CNE1 may be arranged in a sub-pixel area SPA in which the second insulating layer INS2 is disposed. In an embodiment, the first contact electrode CNE1 may be disposed on the first electrode ELT1 to contact a portion of the first electrode ELT1 arranged in the corresponding sub-pixel area SPA. Further, the first contact electrode CNE1 may be disposed on the first end EP1 of at least one light emitting element LD arranged in the corresponding sub-pixel area SPA so as to contact the first end EP1. By means of the first contact electrode CNE1, the first end EP1 of at least one light emitting element LD arranged in the sub-pixel area SPA may be electrically connected to the first electrode ELT1 arranged in the corresponding sub-pixel area SPA.

In the sub-pixel area SPA in which the first contact electrode CNE1 is arranged, a fourth insulating layer INS4 may be arranged. In an embodiment, the fourth insulating layer INS4 may cover the second insulating layer INS2 and the first contact electrode CNE1 which are arranged in the corresponding sub-pixel area SPA.

In an embodiment, similar to the first to third insulating layers INS1, INS2, and INS3, the fourth insulating layer INS4 may be formed in a single layer or multi-layer structure and may include at least one inorganic and/or organic insulating material. For example, the fourth insulating layer INS4 may include various organic/inorganic insulating materials including SiNx. The fourth insulating layer INS4 may include an insulating material different from those of the first to third insulating layers INS1, INS2, and INS3, or may include an insulating material identical to those of at least some of the first to third insulating layers INS1, INS2, and INS3.

In each sub-pixel area SPA in which the fourth insulating layer INS4 is arranged, a second contact electrode CNE2 may be arranged. In an embodiment, the second contact electrode CNE2 may be disposed on the second electrode ELT2 to contact a portion of the second electrode ELT2 arranged in the corresponding sub-pixel area SPA. The second contact electrode CNE2 may be disposed on the second end EP2 of at least one light emitting element LD arranged in the corresponding sub-pixel area SPA so as to electrically contact the second end EP2. By means of the second contact electrode CNE2, the second end EP2 of at least one light emitting element LD arranged in each sub-pixel area SPA may be electrically connected to the second electrode ELT2 arranged in the corresponding sub-pixel area SPA.

The third insulating layer INS3 may be formed and/or disposed on a first surface of the first substrate SUB1 on which the first and second bank patterns PW1 and PW2, the first and second electrodes ELT1 and ELT2, the light emitting elements LD, and the first and second contact electrodes CNE1 and CNE2 are formed such that the third insulating layer INS3 covers the first and second bank patterns PW1 and PW2, the first and second electrodes ELT1 and ELT2, the light emitting elements LD, and the first and second contact electrodes CNE1 and CNE2.

Figure 17D:
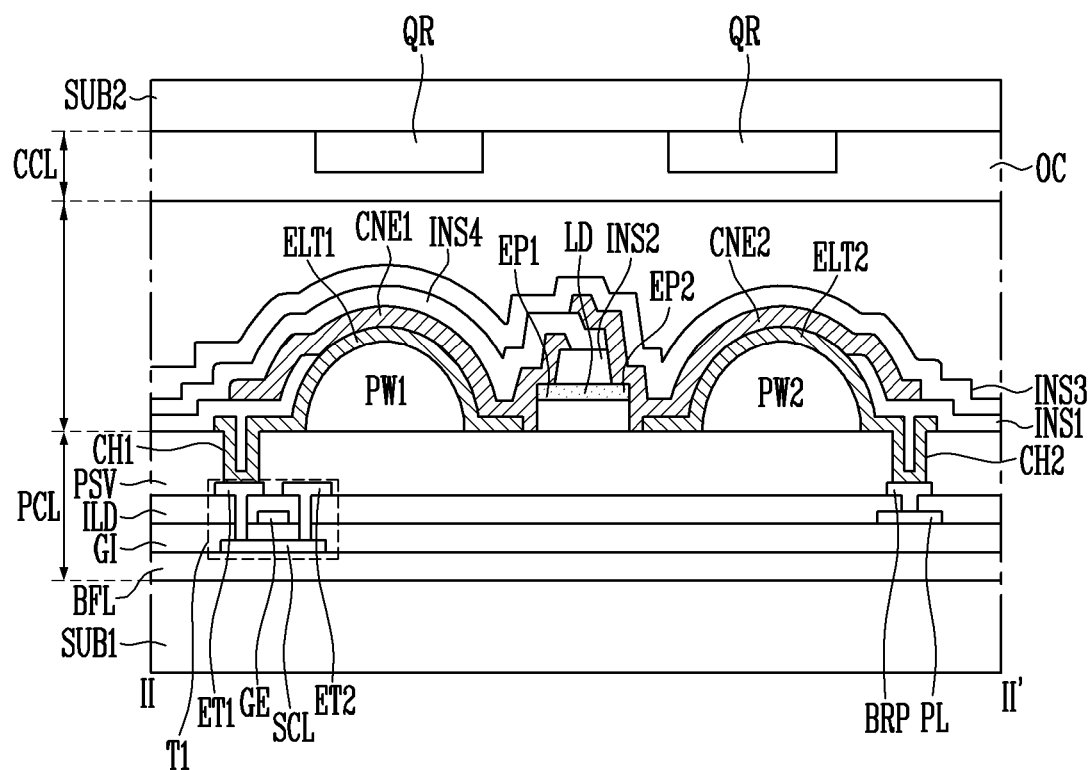

Referring to FIGS. 17C and 17D, the pixel (or sub-pixel) of FIG. 17D may be different from that of FIG. 17C in that the pixel of FIG. 17D includes first and second bank patterns PW1 and PW2 having a cross-sectional shape of a semicircle or a semiellipse.

As illustrated in FIG. 17D, each of the first and second bank patterns PW1 and PW2 may have a cross-sectional shape of a semicircle or a semiellipse, the width of which decreases toward the top thereof. Each of the first and second bank patterns PW1 and PW2 may have a curved surface as at least one side surface thereof.

FIG. 18 is a schematic sectional view illustrating an example of the display device taken along line III-III' of FIG. 15. FIG. 18 schematically illustrates the structure of a pixel PXL, from which a pixel circuit layer PCL is omitted, focusing on a light emitting element layer LDL and a color conversion layer CCL.

Referring to FIGS. 17A to 17D and 18, the pixel PXL of FIG. 18 may be different from those illustrated in FIGS. 17A to 17D at least in that the former further includes banks BNK.

As illustrated in FIG. 18, the banks BNK may be disposed on a first substrate SUB1 (or the pixel circuit layer PCL illustrated in FIGS. 17A to 17D). In embodiments, the banks BNK may be directly disposed on the first insulating layer INS1 illustrated in FIGS. 17A to 17D. The banks BNK may be formed between the sub-pixels SPX to enclose an emission area EMA of each of the sub-pixels SPX and may form a pixel defining layer for partitioning the emission area EMA of the sub-pixel SPX. For example, the emission area EMA of the first sub-pixel SPX1, the emission area EMA of the second sub-pixel SPX2, and the emission area EMA of the third sub-pixel SPX3 may be defined by the banks BNK.

Each bank BNK may block light emitted from the light emitting elements LD of each sub-pixel SPX from passing through the bank BNK, thereby preventing optical interference from occurring in case that the light emitted from each emission area EMA enters an adjacent emission area EMA.

The banks BNK may protrude from the first substrate SUB1 in a height direction. In an embodiment, the height of the banks BNK may be greater than that of the light emitting element layer (for example, the light emitting element layer except for the bank BNK) and may be, for example, equal to or greater than about 2 μm, or equal to or greater than about 2.5 μm.

In providing the light emitting elements LD including a first to third light emitting elements LD1, LD2, and LD3 to the emission area EMA, the banks BNK may function as a dam structure for preventing a solution mixed with the light emitting elements LD from flowing into the emission area EMA of an adjacent pixel PX, or for controlling a predetermined amount of solution to be supplied to each emission area EMA.

In embodiments, the color conversion layer CCL may include color conversion elements QR1 and QR2, color filters CF1, CF2, and CF3, and a black matrix BM.

The first color filter CF1 may be disposed on a first surface (e.g., a bottom surface in FIG. 18) of the second substrate SUB2, may overlap the first sub-pixel area SPA1 (or the emission area EMA of the first sub-pixel area SPA1), and may selectively transmit light of a first color, emitted from the light emitting elements LD. For example, the first color filter CF1 may be a first color transmission filter (e.g., a blue transmission filter) which transmits only a first color (e.g., blue).

Similarly, the second color filter CF2 may be disposed on the first surface (e.g., the bottom surface in FIG. 18) of the second substrate SUB2, may overlap the second sub-pixel area SPA2 (or the emission area EMA of the second sub-pixel area SPA2), and may selectively transmit light of a second color, emitted through the first color conversion element QR1. For example, the second color filter CF2 may be a second color transmission filter (e.g., a green transmission filter) which transmits only a second color (e.g., green).

The third color filter CF3 may be disposed on the first surface (e.g., the bottom surface in FIG. 18) of the second substrate SUB2, may overlap the third sub-pixel area SPA3 (or the emission area EMA of the third sub-pixel area SPA3), and may selectively transmit light of a third color, emitted through the second color conversion element QR2. For example, the third color filter CF3 may be a third color transmission filter (e.g., a red transmission filter) which transmits only a third color (e.g., red).

In an embodiment, all of the light emitting elements LD may emit light of a same color. Further, a color conversion layer CCL may be disposed on the top of at least some of the first, second, and third sub-pixels SPX1, SPX2, and SPX3. Therefore, the display device according to an embodiment may display a full-color image.

Black matrices BM may be disposed between the first, second, and third color filters CF1, CF2, and CF3. For example, black matrices BM may be disposed on the first surface (e.g., a bottom surface in FIG. 18) of the second substrate SUB2 so as to overlap the banks BNK on the first substrate SUB1.

As described above with reference to FIG. 18, color conversion elements QR1 and QR2 and color filters CF may be disposed on at least some sub-pixels SPX, and thus a full-color pixel PXL and a display device having the full-color pixel PXL may be implemented.

In an embodiment, respective sub-pixels SPX may form respective light emitting devices. For example, a first sub-pixel SPX1 corresponding to a red sub-pixel may form a red light emitting device, a second sub-pixel SPX2 corresponding to a green sub-pixel may form a green light emitting device, and a third sub-pixel SPX3 corresponding to a blue sub-pixel may form a blue light emitting device. A full-color pixel PXL including the first, second, and third sub-pixels SPX1, SPX2, and SPX3 may form a full-color light emitting device. For example, the embodiment is not limited to a display device and may be widely applied to other types of devices requiring light sources.

While the spirit and scope of the disclosure is described in detail by embodiments, it should be noted that the above-described embodiments are merely descriptive and should not be considered limiting. Further, it should be understood by those skilled in the art that various changes, substitutions, and alternations may be made herein without departing from the scope of the disclosure as defined by the following claims.

The scope of the disclosure is not limited by detailed descriptions of the specification and should be defined by the accompanying claims. Further, all changes or modifications of the disclosure derived from the meanings and scope of the claims, and equivalents thereof should be construed as being included in the scope of the disclosure.

What is claimed is:

1. A light emitting device, comprising:
   a substrate;
   a light emitting element layer disposed on the substrate and including a plurality of light emitting elements having a rod shape; and
   a color conversion layer disposed on the light emitting element layer and including a plurality of color conversion elements having a rod shape,
   wherein a first alignment direction of the plurality of light emitting elements and a second alignment direction of the plurality of color conversion elements are substantially parallel to each other or intersect at a predetermined angle.

2. The light emitting device according to claim 1, wherein each of the plurality of color conversion elements is a quantum rod.

3. The light emitting device according to claim 2, wherein the quantum rod converts first monochromatic light emitted from the plurality of light emitting elements into second monochromatic light.

4. The light emitting device according to claim 2, wherein the predetermined angle between the second alignment direction and the first alignment direction is about 30 or less degrees.

5. The light emitting device according to claim 4, wherein
   the first alignment direction is a direction in which ¾ or more of the plurality of light emitting elements are arranged, and
   the second alignment direction is a direction in which ¾ or more of the plurality of color conversion elements are arranged.

6. The light emitting device according to claim 1, wherein the light emitting element layer further comprises:
   a first electrode and a second electrode disposed on the substrate and spaced apart from each other; and
   a first insulating layer disposed on the first and second electrodes and the substrate, and
   the plurality of light emitting elements are disposed between the substrate and the first insulating layer and between the first electrode and the second electrode.

7. The light emitting device according to claim 6, further comprising:
   a common electrode layer disposed between the substrate and the light emitting element layer; and
   a second insulating layer disposed between the common electrode layer and the light emitting element layer, wherein
   the common electrode layer includes a first common electrode and a second common electrode disposed to be spaced apart from each other,
   the first common electrode overlaps the first electrode and is electrically disconnected from the first electrode, and
   the second common electrode overlaps the second electrode.

8. The light emitting device according to claim 7, wherein
   the plurality of light emitting elements are disposed between the first and second electrodes and the second insulating layer,
   a first end of each of the plurality of light emitting elements are electrically connected to the first electrode, and
   a second end of each of the plurality of light emitting elements are electrically connected to the second electrode.

9. The light emitting device according to claim 7, wherein the plurality of color conversion elements are disposed between the first common electrode and the second common electrode in a plan view.

10. The light emitting device according to claim 1, wherein
    the substrate includes a first sub-pixel area, a second sub-pixel area, and a third sub-pixel area,
    the plurality of light emitting elements emit light of a first color, and
    the plurality of color conversion elements comprise:
      a first color conversion element arranged in the second sub-pixel area and converting the light of the first color into light of a second color; and
      a second color conversion element arranged in the third sub-pixel area and converting the light of the first color into light of a third color.

11. A display device, comprising:
    a first substrate;
    a light emitting element layer including a plurality of light emitting elements having a rod shape and disposed on the first substrate;
    a color conversion layer including a plurality of color conversion elements having a rod shape and disposed on the light emitting element layer; and
    a second substrate disposed on the color conversion layer,
    wherein a first alignment direction of the plurality of light emitting elements and a second alignment direction of the plurality of color conversion elements are substantially parallel to each other.

12. The display device according to claim 11, wherein
    the light emitting element layer further includes a first electrode and a second electrode disposed on the first substrate and spaced apart from each other, and
    the plurality of light emitting elements are disposed between the first electrode and the second electrode.

13. The display device according to claim 12, further comprising:
    a pixel circuit layer disposed between the first substrate and the light emitting element layer, the pixel circuit layer including a plurality of transistors and a power line, wherein
    the first electrode is electrically connected to a first electrode of a first transistor of the plurality of transistors, through a first contact hole passing through at least a part of the pixel circuit layer, and the second electrode is electrically connected to the power line through a second contact hole passing through at least a part of the pixel circuit layer.

14. The display device according to claim 13, wherein the light emitting element layer further comprises:
   a first contact electrode electrically connecting a first end of each of the plurality of light emitting elements to the first electrode; and
   a second contact electrode electrically connecting a second end of each of the plurality of light emitting elements to the second electrode, and the first contact electrode and the second contact electrode are disposed on a same layer.

15. The display device according to claim 14, wherein the light emitting element layer further comprises:
   a first bank pattern disposed between the first electrode and the pixel circuit layer; and
   a second bank pattern disposed between the second electrode and the pixel circuit layer.

* * * * *